(12) United States Patent
Bringivijayaraghavan et al.

(10) Patent No.: US 11,580,059 B2
(45) Date of Patent: Feb. 14, 2023

(54) MULTI-PORT MEMORY ARCHITECTURE FOR A SYSTOLIC ARRAY

(71) Applicant: MARVELL INTERNATIONAL LTD., Hamilton (BM)

(72) Inventors: Venkatraghavan Bringivijayaraghavan, Cheyyar (IN); Aravindan J. Busi, Bangalore (IN); Deepak I. Hanagandi, Bangalore (IN); Igor Arsovski, Williston, VT (US)

(73) Assignee: Marvell Asia Pte. Ltd., Singapore (SG)

( * ) Notice: Subject to any disclaimer, the term of this patent is extended or adjusted under 35 U.S.C. 154(b) by 0 days.

(21) Appl. No.: 16/527,100

(22) Filed: Jul. 31, 2019

(65) Prior Publication Data

US 2021/0034567 A1 Feb. 4, 2021

(51) Int. Cl.
*G06F 15/80* (2006.01)
*G06F 3/06* (2006.01)
*G11C 11/419* (2006.01)

(52) U.S. Cl.
CPC ........ *G06F 15/8046* (2013.01); *G06F 3/0625* (2013.01); *G06F 3/0626* (2013.01); *G06F 3/0659* (2013.01); *G06F 3/0673* (2013.01); *G11C 11/419* (2013.01)

(58) Field of Classification Search
CPC ...... G06F 12/00; G06F 3/0625; G06F 3/0626; G06F 3/0659; G06F 3/0673; G06F 15/8046; G11C 11/419
USPC .......................................................... 711/154
See application file for complete search history.

(56) References Cited

U.S. PATENT DOCUMENTS

| 5,481,487 | A | 1/1996 | Jang et al. |
| 5,914,910 | A | 6/1999 | Mori |
| 8,782,115 | B1 | 7/2014 | Dhanoa |
| 8,924,455 | B1 * | 12/2014 | Barman ................ G06F 7/5443 |
| | | | 708/607 |

(Continued)

FOREIGN PATENT DOCUMENTS

CN 108628799 A 10/2018

OTHER PUBLICATIONS

Martinez et al., "High Performance Embedded Computing Handbook: A Systems Perspective", Massachusetts Institute of Technology, 2008, pp. 248-251.

(Continued)

*Primary Examiner* — Gautam Sain

(57) ABSTRACT

A memory architecture and a processing unit that incorporates the memory architecture and a systolic array. The memory architecture includes: memory array(s) with multi-port (MP) memory cells; first wordlines connected to the cells in each row; and, depending upon the embodiment, second wordlines connected to diagonals of cells or diagonals of sets of cells. Data from a data input matrix is written to the memory cells during first port write operations using the first wordlines and read out from the memory cells during second port read operations using the second wordlines. Due to the diagonal orientation of the second wordlines and due to additional features (e.g., additional rows of memory cells that store static zero data values or read data mask generators that generate read data masks), data read from the memory architecture and input directly into a systolic array is in the proper order, as specified by a data setup matrix.

19 Claims, 14 Drawing Sheets

*See exemplary memory array(s) in Figures 7-8, and 11-16
**See Exemplary MP memory cell in Figure 3

(56) References Cited

U.S. PATENT DOCUMENTS

| | | | | |
|---|---|---|---|---|
| 2009/0073796 | A1* | 3/2009 | Ahsan | G11C 8/08 |
| | | | | 365/230.03 |
| 2015/0006986 | A1* | 1/2015 | Buyuktosunoglu | G11C 29/32 |
| | | | | 714/727 |
| 2017/0364408 | A1* | 12/2017 | Sherman | G06F 3/064 |
| 2018/0307438 | A1* | 10/2018 | Huang | G06F 5/065 |
| 2018/0307980 | A1* | 10/2018 | Barik | G06N 3/0445 |
| 2020/0272596 | A1* | 8/2020 | Narayanamoorthy | ............ |
| | | | | G06F 15/8023 |

OTHER PUBLICATIONS

Sato et al., "An In-Depth Look at Google's First Tensor Processing Unit (TPU)", Google Cloud, Blog, AI & Machine Learning, 2017, pp. 1-17. https://cloud.google.com/blog/products/gcp/an-in-depth-look-at-googles-first-tensor-processing-unit-tpu.

* cited by examiner

*See exemplary memory array(s) in Figures 7-8, and 11-16
**See Exemplary MP memory cell in Figure 3

| RWL | AW |||  RM |||
|---|---|---|---|---|---|---|
| | <2> | <1> | <0> | $801_2$ | $801_1$ | $801_0$ |
| 0 | 0 | 0 | 0 | 1 | 1 | 0 |
| 1 | 0 | 0 | 1 | 1 | 0 | 0 |
| 2 | 0 | 1 | 0 | 0 | 0 | 0 |
| 3 | 0 | 1 | 1 | 0 | 0 | 1 |
| 4 | 1 | 0 | 0 | 0 | 1 | 1 |
FIG. 9
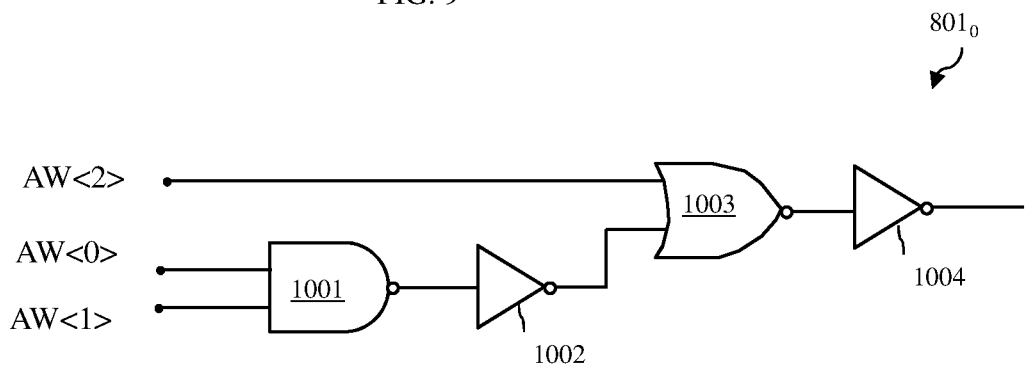
FIG. 10A
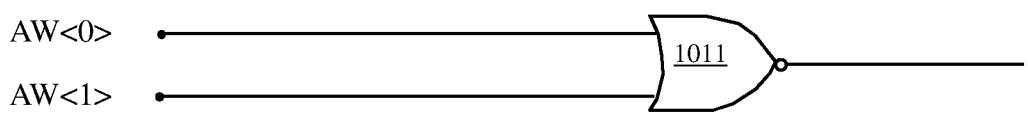
FIG. 10B
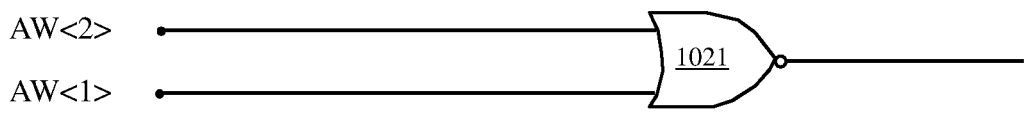
FIG. 10C

|   |   | RWL0 | RWL1 | RWL2 | RWL3 | RWL4 |
|---|---|---|---|---|---|---|
| 0 | 0 | A1-b0 | A2-b0 | A3-b0 | 0 | 0 |
| 0 | 0 | A1-b1 | A2-b1 | A3-b1 | 0 | 0 |
| 0 | 0 | A1-b2 | A2-b2 | A3-b2 | 0 | 0 |
| 0 | 0 | A1-b3 | A2-b3 | A3-b3 | 0 | 0 |
| 0 | 0 | A1-b4 | A2-b4 | A3-b4 | 0 | 0 |
| 0 | 0 | A1-b5 | A2-b5 | A3-b5 | 0 | 0 |
| 0 | 0 | A1-b6 | A2-b6 | A3-b6 | 0 | 0 |
| 0 | 0 | A1-b7 | A2-b7 | A3-b7 | 0 | 0 |
| 0 | 0 | B1-b0 | B2-b0 | B3-b0 | 0 | 0 |
| 0 | 0 | B1-b1 | B2-b1 | B3-b1 | 0 | 0 |
| 0 | 0 | B1-b2 | B2-b2 | B3-b2 | 0 | 0 |
| 0 | 0 | B1-b3 | B2-b3 | B3-b3 | 0 | 0 |
| 0 | 0 | B1-b4 | B2-b4 | B3-b4 | 0 | 0 |
| 0 | 0 | B1-b5 | B2-b5 | B3-b5 | 0 | 0 |
| 0 | 0 | B1-b6 | B2-b6 | B3-b6 | 0 | 0 |
| 0 | 0 | B1-b7 | B2-b7 | B3-b7 | 0 | 0 |
| 0 | 0 | C1-b0 | C2-b0 | C3-b0 | 0 | 0 |
| 0 | 0 | C1-b1 | C2-b1 | C3-b1 | 0 | 0 |
| 0 | 0 | C1-b2 | C2-b2 | C3-b2 | 0 | 0 |
| 0 | 0 | C1-b3 | C2-b3 | C3-b3 | 0 | 0 |
| 0 | 0 | C1-b4 | C2-b4 | C3-b4 | 0 | 0 |
| 0 | 0 | C1-b5 | C2-b5 | C3-b5 | 0 | 0 |
| 0 | 0 | C1-b6 | C2-b6 | C3-b6 | 0 | 0 |
| 0 | 0 | C1-b7 | C2-b7 | C3-b7 | 0 | 0 |

FIG. 13  (Note: BLs and WWLs not shown)

| 1522(1) (b0-b7) | 1502(a) | RWL0 | RWL1 | RWL2 | RWL3 | RWL4 |
|---|---|---|---|---|---|---|
| 0 | 0 | A1-b0 | A2-b0 | A3-b0 | 0 | 0 |
| 0 | 0 | A1-b1 | A2-b1 | A3-b1 | 0 | 0 |
| 0 | 0 | A1-b2 | A2-b2 | A3-b2 | 0 | 0 |
| 0 | 0 | A1-b3 | A2-b3 | A3-b3 | 0 | 0 |
| 0 | 0 | A1-b4 | A2-b4 | A3-b4 | 0 | 0 |
| 0 | 0 | A1-b5 | A2-b5 | A3-b5 | 0 | 0 |
| 0 | 0 | A1-b6 | A2-b6 | A3-b6 | 0 | 0 |
| 0 | 0 | A1-b7 | A2-b7 | A3-b7 | 0 | 0 |
| 0 | 0 | B1-b0 | B2-b0 | B3-b0 | 0 | 0 |
| 0 | 0 | B1-b1 | B2-b1 | B3-b1 | 0 | 0 |
| 0 | 0 | B1-b2 | B2-b2 | B3-b2 | 0 | 0 |
| 0 | 0 | B1-b3 | B2-b3 | B3-b3 | 0 | 0 |
| 0 | 0 | B1-b4 | B2-b4 | B3-b4 | 0 | 0 |
| 0 | 0 | B1-b5 | B2-b5 | B3-b5 | 0 | 0 |
| 0 | 0 | B1-b6 | B2-b6 | B3-b6 | 0 | 0 |
| 0 | 0 | B1-b7 | B2-b7 | B3-b7 | 0 | 0 |
| 0 | 0 | C1-b0 | C2-b0 | C3-b0 | 0 | 0 |
| 0 | 0 | C1-b1 | C2-b1 | C3-b1 | 0 | 0 |
| 0 | 0 | C1-b2 | C2-b2 | C3-b2 | 0 | 0 |
| 0 | 0 | C1-b3 | C2-b3 | C3-b3 | 0 | 0 |
| 0 | 0 | C1-b4 | C2-b4 | C3-b4 | 0 | 0 |
| 0 | 0 | C1-b5 | C2-b5 | C3-b5 | 0 | 0 |
| 0 | 0 | C1-b6 | C2-b6 | C3-b6 | 0 | 0 |
| 0 | 0 | C1-b7 | C2-b7 | C3-b7 | 0 | 0 |

FIG. 15  (Note: RWLs for 1522(2)-1522(4) and BLs and WWLs for 1522(1)-1522(4) not shown)

MULTI-PORT MEMORY ARCHITECTURE FOR A SYSTOLIC ARRAY

BACKGROUND

Field of the Invention

The present invention relates to systolic arrays in processing units and, more particularly, to data storage and setup for a systolic array in a processing unit.

Description of Related Art

Processing units typically require multiple processing elements (PE) (e.g., arithmetic logic units (ALUs)) to complete an operation. During an operation, each PE processes data inputs received from a memory and stores data outputs back in the memory. However, using discrete memories for each PE is costly in terms of both chip area consumption and energy consumption, particularly when an operation requires processing by a significant number of PEs to complete. Applications, which employ processing units that require a significant number of PEs to complete an operation, include, but are not limited to, artificial intelligence (AI) and machine learning (ML) applications (e.g., tensor processing (TP) applications), digital signal processing (DSP) applications, advanced driver assist system (ADAS) applications, neural network (NN) and deep learning (DL) applications, fast Fourier transforms (FFTs), and digital filtering applications (e.g., finite impulse response (FIR) and infinite impulse response (IIR)).

In order to save area and energy, processing units that incorporate systolic arrays (also referred to as systolic processors) have been developed. In a processing unit with a systolic array, a pipeline of PEs is used. A first PE receives a series of first data inputs accessed from a memory, processes the first data inputs and forwards a series of first data outputs to the next PE in the pipeline. The next PE in the pipeline receives the series of first data outputs from the first PE, processes them and forwards a series of second data outputs to the next PE in the pipeline; and so on until the last PE in the pipeline outputs a series of final data outputs for storage back in the memory. However, to ensure that the first data inputs received by the first PE are in the proper order for processing, prior art processing units that incorporate a systolic array also incorporate a data setup logic block in line between the memory and the first PE in the pipeline. The data setup logic block reads data from the memory, reorganizes that data according to a data setup matrix and feeds the correct series of first data inputs into the first PE. Unfortunately, the discrete data setup logic block can also be costly in terms of chip area consumption and energy consumption.

SUMMARY

In view of the foregoing, disclosed herein are embodiments of a memory architecture and of a processing unit, which incorporates any one of the memory architecture embodiments to directly feed a series of data inputs into a systolic array in the proper order, as specified by a data setup matrix for the systolic array.

One embodiment of the memory architecture includes a memory array and, particularly, an array of multi-port (MP) memory cells arranged in columns, rows and diagonals. Each memory cell in the memory array includes a first port, which is at least a write port, and a second port, which is at least a read port. The memory architecture further includes first and second wordlines. Each first wordline can be connected to the first port of all of the memory cells in a corresponding row of the memory cells, respectively, to enable first port write operations. Each second wordline can be connected to the second port of all of the memory cells in a corresponding diagonal of the memory cells to enable the second port read operations. The memory array is configured to store data acquired from data input fields of a data input matrix during the first port read operations. The memory array further includes additional features (e.g., extra rows of memory cells that store static zero values or read data mask generators that generate read data masks, as discussed further in the detailed description section below), which ensure that a series of data outputs from the memory array during the second port read operations is in the proper order (as specified in a data setup matrix) for being processed by a systolic array.

Another embodiment of the memory architecture includes multiple memory arrays and, particularly, multiple arrays of multi-port (MP) memory cells arranged in columns, rows and diagonals. Each memory cell in each memory array can include a first port, which is at least a write port, and a second port, which is at least a read port. The memory architecture further includes first and second wordlines for each of the memory arrays. Each first wordline of each memory array can be connected to the first port of all of the memory cells in a corresponding row of the memory cells, respectively, in that memory array in order to enable first port write operations. Each second wordline of each memory array is connected to the second port of all of the memory cells in a corresponding diagonal of the memory cells, respectively, in the memory array in order to enable the second port read operations. The memory arrays are configured to store data acquired from data input fields of a data input matrix during the first port read operations. The memory arrays further include additional features (e.g., extra rows of memory cells in each array that store static zero values or read data mask generators that generate read data masks, as discussed further in the detailed description section below), which ensure that a series of multi-bit outputs from the memory architecture during the second port read operations is in a proper order (as specified by a data setup matrix) for being processed by a systolic array. In this embodiment, second port read operations are performed in parallel in the different memory arrays such that each memory array outputs a series of single-bit outputs and the single-bit outputs are combined so that the memory architecture outputs the series of multi-bit outputs.

Yet another embodiment of the memory architecture can include a memory array and, particularly, an array of multi-port (MP) memory cells arranged in columns and rows. Each memory cell can include a first port, which is at least a write port, and a second port, which is at least a read port. Additionally, each row of memory cells in the memory array can include a same number of memory cell sets, each set having a same number of memory cells. Thus, within the columns and rows of memory cells in the memory array, there are also diagonals of memory cell sets. The memory architecture can further include first wordlines and second wordlines. Each first wordline can be connected to the first port of all of the memory cells of all of the memory cell sets in a corresponding row of the memory cells in order to enable first port write operations. Each second wordline can be connected to all of the memory cells in all of the memory cell sets in a corresponding diagonal of the memory cell sets in order to enable second port read operations. The memory array can further be configured to store data acquired from data input fields of a data input matrix during the first port read operations with each memory cell set storing a multi-bit data value. The memory array can further include additional features (e.g., extra rows of memory cells that store static zero values or read data mask generators that generate read data masks, as discussed further in the detailed description section below), which ensure that a series of multi-bit outputs from the memory architecture during the second port read operations are in a proper order (as specified by a data setup matrix) for being processed by a systolic array.

In other similar embodiments, a memory architecture can incorporate multiple memory arrays (e.g., four memory arrays) configured as described above and, during parallel second port read operations, each memory array can output a series of relatively small multi-bit outputs (e.g., 8-bit outputs) so that, in combination, a series of relatively large multi-bit outputs (e.g., 32-bit outputs) are read out by the memory architecture and in a proper order for being processed by a systolic array.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 9 is chart showing truth tables for the three read data mask generators of FIG. 8;

FIGS. 10A-10C are schematic diagrams illustrating exemplary custom logic circuits for the three read data mask generators of FIG. 8, respectively, suitable for achieving the outputs specified in the truth tables of FIG. 9;

FIGS. 13 and 14 are schematic diagrams each illustrating a single memory array that could be incorporated into the memory architecture of FIG. 2 in order to directly feed a series of multi-bit inputs into the the systolic array; and FIGS. 15 and 16 are schematic diagrams each illustrating multiple memory arrays that could be incorporated into the memory architecture of FIG. 2 with each memory array generating a series of small multi-bit inputs that can be combined so as to directly feed a series of large multi-bit inputs into the the systolic array.

DETAILED DESCRIPTION

Figure 1:
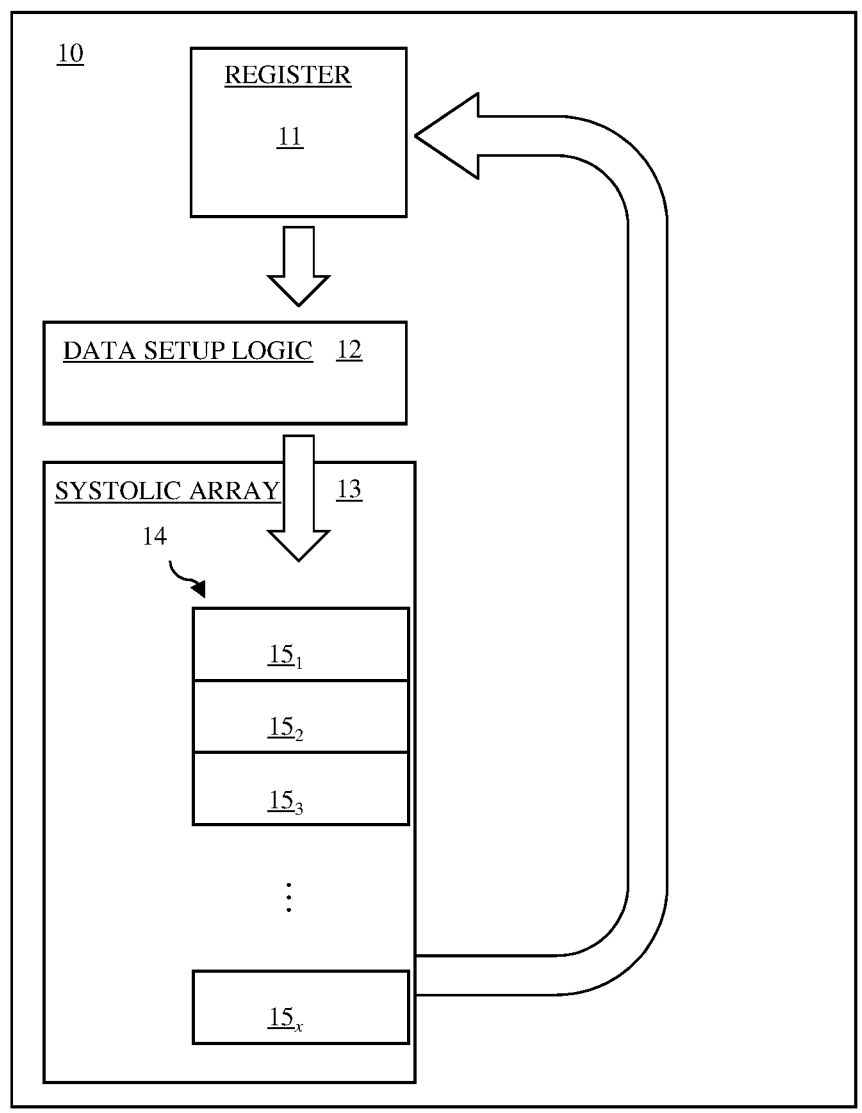
FIG. 1 is a block diagram illustrating a processing unit in which a data setup logic block reorganizes data read out from a memory for input into a systolic array.

As mentioned above, in order to save area and energy, processing units that incorporate systolic arrays (also referred to as systolic processors) have been developed. Referring to FIG. 1, an exemplary processing unit 10 includes a memory 11 (e.g., a register or buffer) and a systolic array 13. The systolic array 13 includes a pipeline 14 of processing elements (PEs) $15_1$-$15_x$ (e.g., arithmetic logic units (ALUs)). During an operation, the first PE 151 receives a series of first data inputs accessed from the memory 11, processes the first data inputs and forwards a series of first data outputs to the next PE 152 in the pipeline 14. The next PE 152 in the pipeline 14 receives the series of first data outputs from the first PE $15_1$, processes them and forwards a series of second data outputs to the next PE 153 in the pipeline 14; and so on until the last PE $15_x$ in the pipeline 14 outputs a series of final data outputs for storage back in the memory 11. However, to ensure that the first data inputs received by the first PE $15_1$ in the pipeline 14 are in the proper order for processing, prior art processing units 10 also incorporate a data setup logic block 12, which is in line between the memory 11 and the first PE $15_1$ in the pipeline 14. The data setup logic block 12 reads the data from the memory 11, reorganizes that data according to a data setup matrix (e.g., using delay elements, such as shift registers) and feeds the correct series of first data inputs into the first PE $15_1$. For example, a processing unit with a 128 by 128 multiply and accumulate (MAC) array requires a data setup logic block with 8000 shift registers to accomplish the data setup. Thus, the use of the data setup logic block 12 is also costly in terms of chip area consumption and energy consumption.

Figure 2:
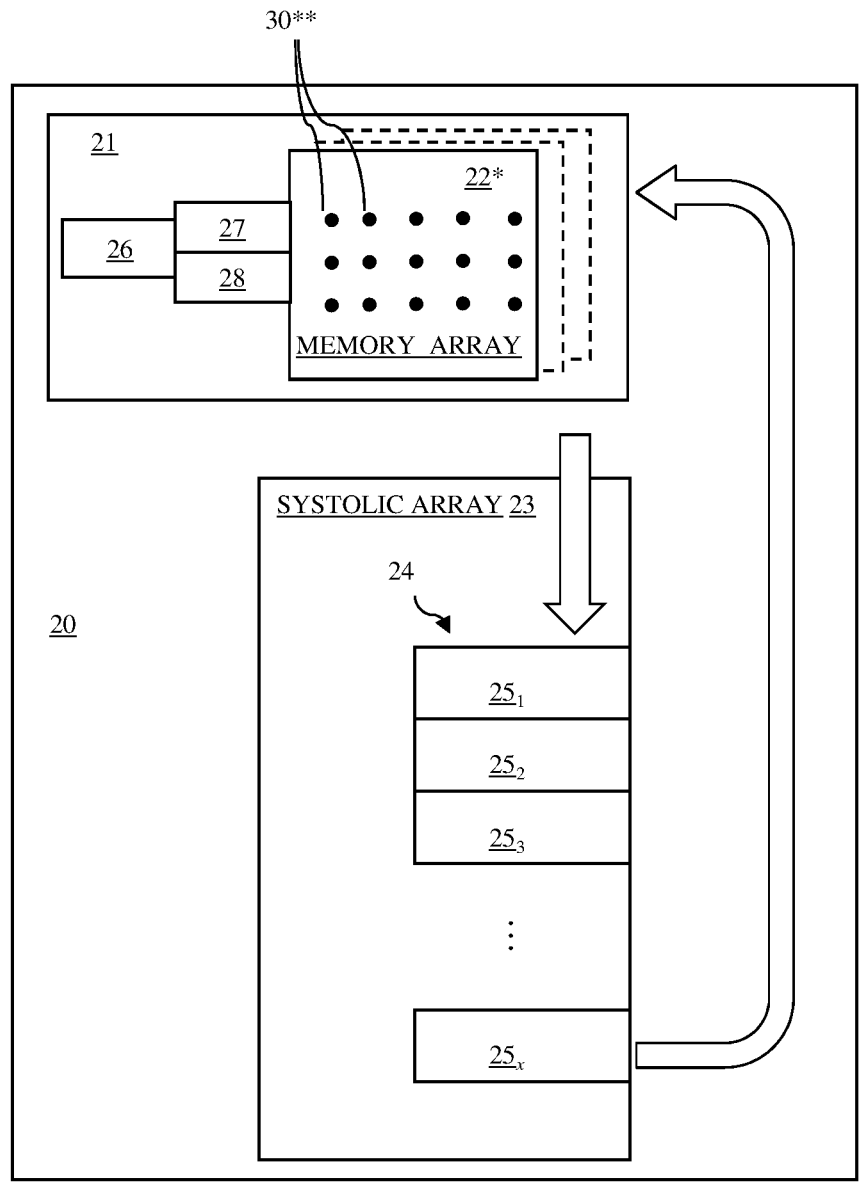
FIG. 2 is a block diagram illustrating disclosed embodiments of a processing unit and of a memory architecture, which is incorporated into the processing unit and which eliminates the need for the data setup logic block shown in FIG. 1.

Therefore, referring to FIG. 2, disclosed herein are embodiments of a memory architecture 21 and of a processing unit 20, which includes a systolic array 23 with a pipeline 24 of PE's $25_1$-$25_x$ (e.g., ALUs) and which further incorporates any one of the embodiments of the memory architecture 21 to feed data directly to the systolic array 23 in the proper order, as specified by a data setup matrix for the systolic array 23, thereby eliminating the need for a discrete data setup logic block.

Each of the disclosed embodiments of the memory architecture 21 can include: a memory controller 26 and at least one memory array 22 of memory cells 30 and the peripheral and sense circuitry 27-28 required to write data to and read data from the memory cells 30.

Figure 3:
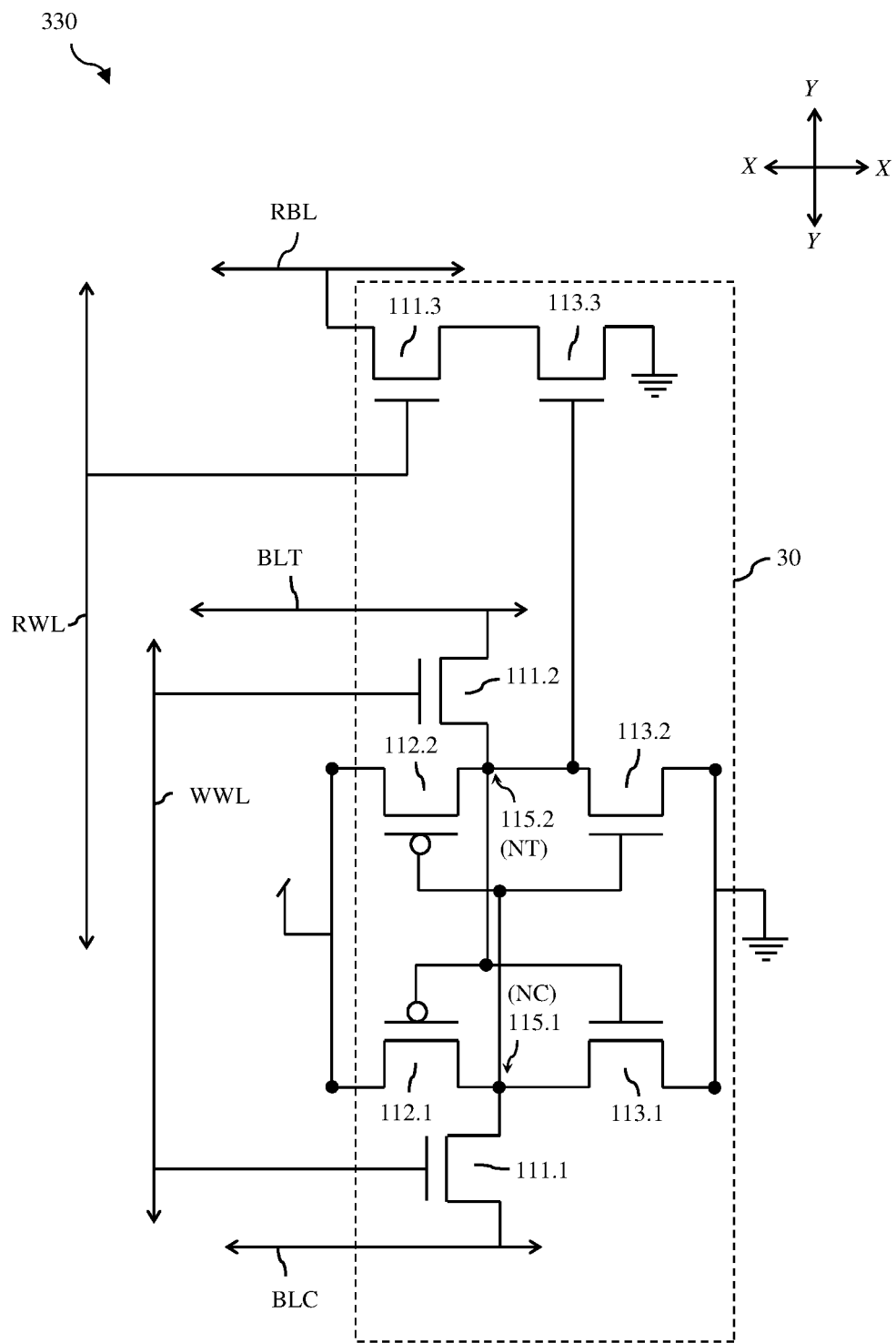
FIG. 3 is a schematic diagram illustrating an exemplary multi-port (MP) memory cell and, particularly, a two-port (2P) memory cell that can be incorporated into the memory array(s) of the memory architecture of FIG. 2.

Each of the memory cells 30 can be a multi-port (MP) memory cell configured at least for first port write operations (e.g., exclusively for first port write operations or for first port read and write operations) and second port read operations (e.g., exclusively for second port read operations or for second port read and write operations). FIG. 3 is a schematic diagram illustrating an exemplary MP static random access memory (SRAM) cell 330, which can be incorporated into the memory array(s) of each of the disclosed embodiments of the memory architecture 21. This exemplary MP-SRAM cell 330 (also referred to herein as a 2P-SRAM cell) is configured for double-ended write operations (or, alternatively, double-ended read/write operations) through a first port (port A) and also for single-ended read operations through a second port (port B, referred to as a read only port).

This 2P-SRAM cell 330 is an eight-transistor (8T) 2P-SRAM cell. It includes a pair of cross-coupled inverters. The cross-coupled inverters include a first inverter and a second inverter. The first inverter is connected between a positive voltage rail and a ground or negative voltage rail and includes a first pull-up transistor 112.1 connected in series to a first pull-down transistor 113.1. The second inverter is also connected between the positive voltage rail and the ground or negative rail and includes a second pull-up transistor 112.2 connected in series to a second pull-down transistor 113.2. In these cross-coupled inverters, a voltage level at a first storage node 115.1 (NC) at the interface between the first pull-up transistor 112.1 and the first pull-down transistor 113.1 controls the gates of second pull-up transistor 112.2 and the second pull-down transistor 113.2 and a voltage level at a second storage node 115.2 (NT) at the interface between the second pull-up transistor 112.2 and the second pull-down transistor 113.2 controls the gates of first pull-up transistor 112.1 and the first pull-down transistor 113.1. The above-mentioned pull-up transistors are p-type field effect transistors (PFETs) and the above-mentioned pass-gate and pull-down transistors are n-type field effect transistors (NFETs).

The first port (i.e., port A) can be a write only port for performing double-ended write operations only (or, alternatively, a read/write port for performing double-ended read or write operations). Specifically, a first pass-gate transistor 111.1 selectively connects a first bitline (referred to herein as the complement bitline (BLC)) of a pair of complementary bitlines to the first storage node 115.1 (NC) and a second pass-gate transistor 111.2 selectively connects a second bitline (referred to herein as the true bitline (BLT)) of the pair of complementary bitlines to the second storage node 115.2 (NT). The gates of the first pass-gate transistor 111.1 and the second pass-gate transistor 111.2 can be controlled by the same first wordline (referred to herein as the write wordline (WWL)). A double-ended write operation can be performed as follows. If a data value of "0" (i.e., a low data value) is to be written to the second storage node 115.2 (NT) (and, thus, a "1" on the first storage node 115.1 (NC)), then the BLC is pre-charged and the BLT is discharged. Next, WWL is activated to enable the first pass-gate transistor 111.1 and the second pass-gate transistor 111.2 and the data value "0" is stored on the second storage node 115.2 (NT). Contrarily, if a data value of "1" (i.e., a high data value) is to be written to the second storage node 115.2 (NT) (and, thus, a "0" on the first storage node 115.1 (NC)), the BLC is discharged and the BLT is pre-charged. Then, WWL is activated to enable the first pass-gate transistor 111.1 and the second pass-gate transistor 111.2 and the data value "1" is stored on the second storage node 115.2 (NT).

The second port (i.e., port B) can be a read-only port for performing single-ended read operations to determine the stored data value (e.g., in the second storage node 115.2 (NT)). Specifically, an additional pass-gate transistor 111.3 and an additional pull-down transistor 113.3 can be electrically connected between an additional bitline (referred to herein as the read bitline (RBL)) and the ground or negative voltage rail. The gate of the additional pass-gate transistor 111.3 can be controlled by the voltage level on a second wordline (referred to herein as a read wordline (RWL)) and the gate of the additional pull-down transistor 113.3 can be controlled by the voltage level at the second storage node 115.2 (NT). A single-ended read operation can be performed by pre-charging RBL, activating RWL, and subsequently sensing a change in the voltage level on RBL and, particularly, sensing whether RBL is discharged or not (i.e., whether or not the voltage level on RBL drops from the pre-charged high voltage level to a low voltage level) following RWL activation. A stored data value of "1" at the second storage node 115.2 (NT) is indicated when the voltage level on RBL is discharged (i.e., drops from high to low) because both the additional pass-gate transistor 111.3 and the additional pull-down transistor 113.3 will turned on, thereby connecting RBL to the ground or negative voltage rail. A stored data value of "0" at the second storage node 115.2 (NT) is indicated when the voltage level on RBL remains at the pre-charged high voltage level because, although the additional pass-gate transistor 111.3 is turned on when the RWL is activated, the additional pull-down transistor 113.3 will remain off.

It should be understood that this 2P-SRAM cell 330 is just one example of a MP-SRAM cell 30 that could be incorporated into the memory array(s) 22 of the disclosed memory architecture 21 embodiments. Alternatively, any other suitable memory cell, which is configured at least for first port write operations and second port read operations, could be used. For example, alternatively, an eight-transistor (8T) dual port (DP) SRAM cell, which is configured for first port read/write operations and for second port read/write operations, could be used.

Figure 4:
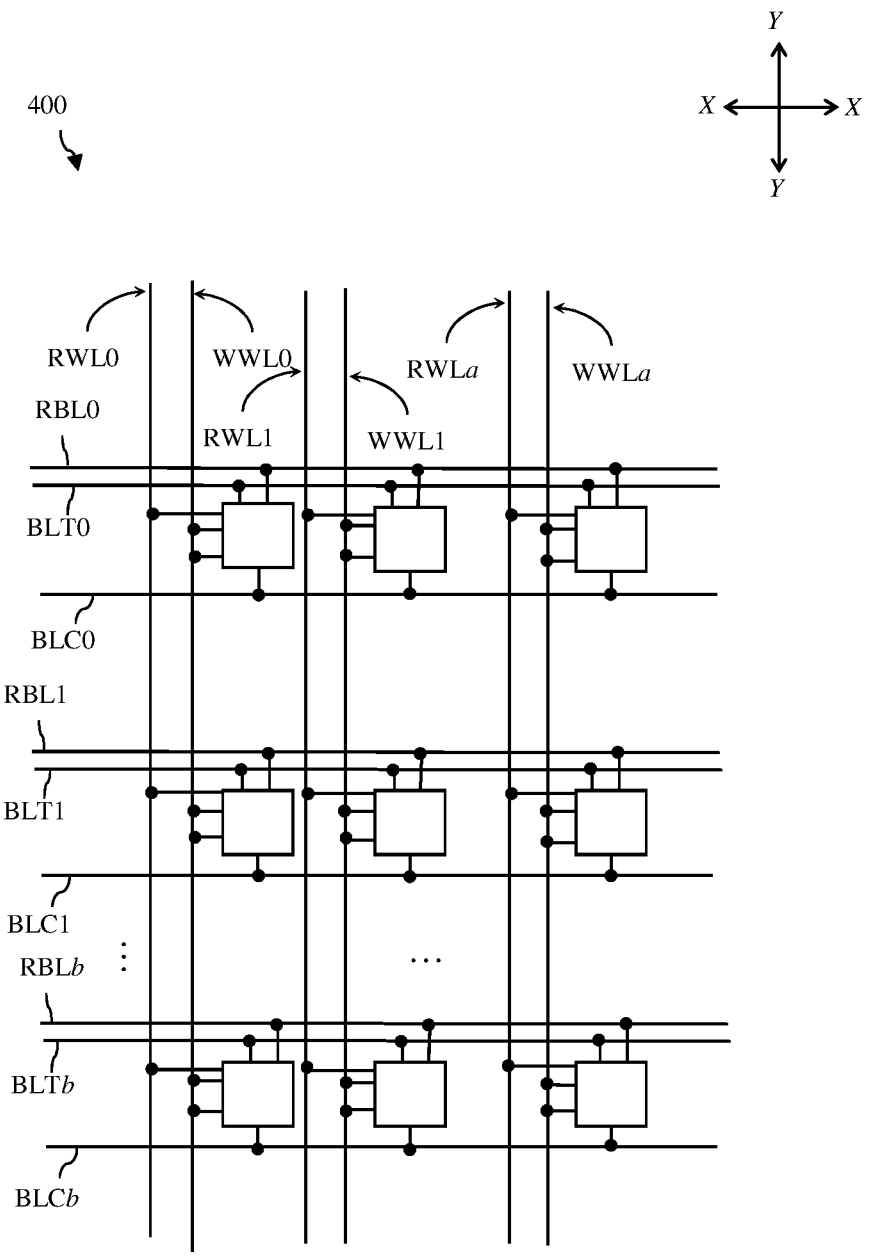
FIG. 4 is a schematic diagram illustrating a conventional memory array with 2P memory cells.

FIG. 4 is a schematic diagram of a conventional MP memory array that incorporates MP memory cells such as the 2P-SRAM cells 330 of FIG. 3. In this conventional MP memory array, the memory cells are arranged in columns and rows. The columns of memory cells are oriented horizontally (i.e., in the X direction, also referred to herein as a first direction) and the rows of memory cells are oriented vertically (i.e., in the Y direction, also referred to as a second direction). It should be understood that the orientation of the columns and rows shown in FIG. 4 is arbitrary and is not intended to be limiting. Thus, alternatively, the rows of memory cells could be oriented horizontally (i.e., in the X or first direction) and the columns of memory cells could be oriented vertically (i.e., in the Y or second direction). In any case, in a conventional 2P-SRAM array, three bitlines (including a pair of complementary biltines (BLT) and (BLC) and a read bitline (RBL)) are oriented in the same direction as each column and all three are connected to all of the memory cells in that column. Additionally, two wordlines (including a first word line (WWL) and a second wordline (RWL)) are oriented in the same direction as each row and are both connected to all of the memory cells in that row.

In the embodiments of the memory architecture 21 disclosed herein, the bitlines are employed by the memory array(s) 22 are configured in essentially the same manner as described above with respect to a conventional MP memory array. Additionally, in the embodiments of the memory architecture 21 disclosed herein the first wordlines (WWL) employed by the memory array(s) 22 are also configured in essentially the same manner as described above with respect to a conventional MP memory array, but the second wordlines (RWLs) are not. Specifically, first wordlines (WWLs) are connected to the first port of all of the memory cells in each of the rows of memory cells, respectively, in order to enable first port write operations. However, instead of being connected to the second port of all the MP memory cells in the rows, respectively, the second wordlines (RWLs) are connected to the second port of all the MP memory cells in corresponding diagonals of MP memory cells (across the rows) or corresponding diagonals of sets of memory cells (across the rows) in order to enable the second port read operations.

In any case, in response to control signals (e.g., row address and column address signals for selecting MP memory cells 30 and read, write or standby signals for indicating the operations to be performed with respect to the selected MP memory cells 30) from the memory controller 26, the peripheral circuitry 27 initiate the first port write operations (i.e., selectively writing data values to the MP memory cells) and the second port read operations (i.e., selectively reading data values from the memory cells). Peripheral circuitry 27 can include, but is not limited to, address decode logic, wordline drivers, column address decode logic, bitline drivers for appropriately biasing selected bitlines during write or read operations. Sense circuitry 28 can include, for example, sense amplifiers that detect the stored date values during the second port read operations. Memory controllers and peripheral and sense circuitry used in memory arrays to write data to and read data from selected MP memory cells the multiple ports are well known in the art. Thus, the details thereof have been omitted from this specification in order to allow the reader to focus on the salient aspects of the disclosed embodiments.

In the disclosed embodiments, a "MP memory array" 22 is made up of MP memory cells 30 (e.g., the SP-SRAM cells 330 shown in FIG. 3). The memory cells 30 are physically aligned in linear groupings along columns and rows on a surface of an integrated circuit (IC) chip. The columns of memory cells 30 may be oriented horizontally (i.e., in the X direction, also referred to herein as the first direction) and the rows of memory cells 30 may be oriented vertically (i.e., in the Y direction, also referred to as the second direction) and, more specifically, essentially perpendicular to the columns. It should be understood that the orientation of the columns and rows is arbitrary and is not intended to be limiting. Thus, alternatively, the rows of memory cells can be oriented horizontally (i.e., in the X or first direction) and the columns of memory cells can be oriented vertically (i.e., in the Y or second direction). It should be understood that the X and Y directions (i.e., the first and second directions) lie in the same plane that is commonly (but not required to be) parallel to the bottom and top surfaces of the IC chip. In any case, the rows are parallel to, and space apart from, each other; and the columns are similarly parallel to, and space apart from, each other.

Generally, such MP memory array(s) 22 can be used to store data acquired from data input fields of a data input matrix for a systolic array 23 during the first port read operations. The memory array(s) 22 can also include additional features (e.g., extra rows of memory cells that store static zero values or read data mask generators that generate read data masks, as discussed in greater detail below), which ensure that a series of data outputs from the memory architecture 21 during the second port read operations is in the proper order for being processed by the systolic array 23 of the processing unit 20, as specified in a data setup matrix that is pre-generated based on the data input matrix. Thus, the disclosed memory architecture 21 embodiments eliminate the need for a discrete data setup logic block in the processing unit 20 and, thereby minimize both chip area consumption and energy consumption.

As discussed in greater detail, different memory array configurations could be employed depending upon the number of columns and rows of data input fields in the data input matrix for the systolic array and further depending upon whether or not the series of data inputs to be applied to the systolic array 23 are to be single-bit inputs (i.e., whether the data input matrix has only a single layer) or multi-bit inputs (i.e., whether the data input matrix has multiple layers).

Figure 5:
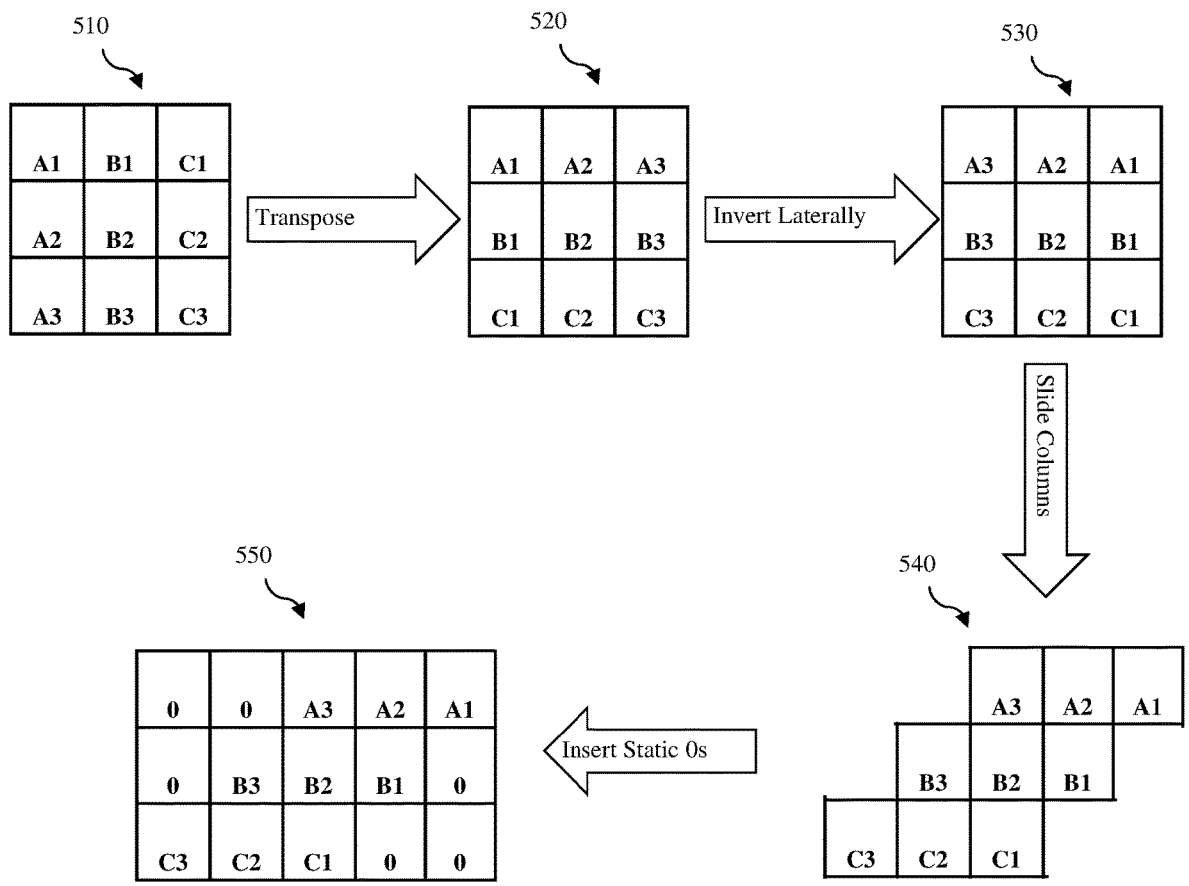
FIG. 5 is a flow chart illustrating exemplary process steps employed to generate a data setup matrix for inputting single-bit data into a systolic array.

FIG. 5 shows an exemplary a single layer data input matrix 520 for a systolic array and the process steps employed to generate a data setup matrix 550 for the systolic array based on this data input matrix 520. The data input matrix 520 has data input fields arranged in a first number m of rows and a second number n of columns. Each row has data input fields labeled A, B, C, etc. For purposes of illustration, the data input matrix has 3 rows and 3 columns. Thus, row 1 includes data input fields labeled A1, B1, C1; row 2 includes data input fields labeled A2, B2, C2; and row 3 includes data input fields labeled A3, B3, C3. The rows of the data input fields of the data input matrix 520 should be oriented in the same direction as the rows of memory cells in a memory array. Thus, preliminary processing may require an initial data input matrix 510 to be transposed if the row of data input fields are oriented in the X direction (as shown). Next, the data input matrix 520 can be laterally inverted (i.e., flipped horizontally) so that the first row (e.g., row 1 with A1, B1, C1) is now on the far right side of the laterally inverted matrix 530 and so that the last row (e.g., row 3 with A3, B3, C3) is now on the far left side of the laterally inverted matrix 530. Individual columns within the laterally inverted matrix 530 can then be slid to generate a torqued matrix 540 with opposing sides that are stepped at the beginnings, ends or beginnings and ends of the n columns. Finally, static zero value input fields can be added to fill in the stepped opposing sides and complete a rectangular-shaped data setup matrix 550. Such a single-layer (i.e., two dimensional) data setup matrix 550 can be employed when the systolic array is designed to process a series of single-bit inputs. As a result, the data setup matrix 550 has ((m+n)−1) rows and n columns of data input fields.

Figure 6:
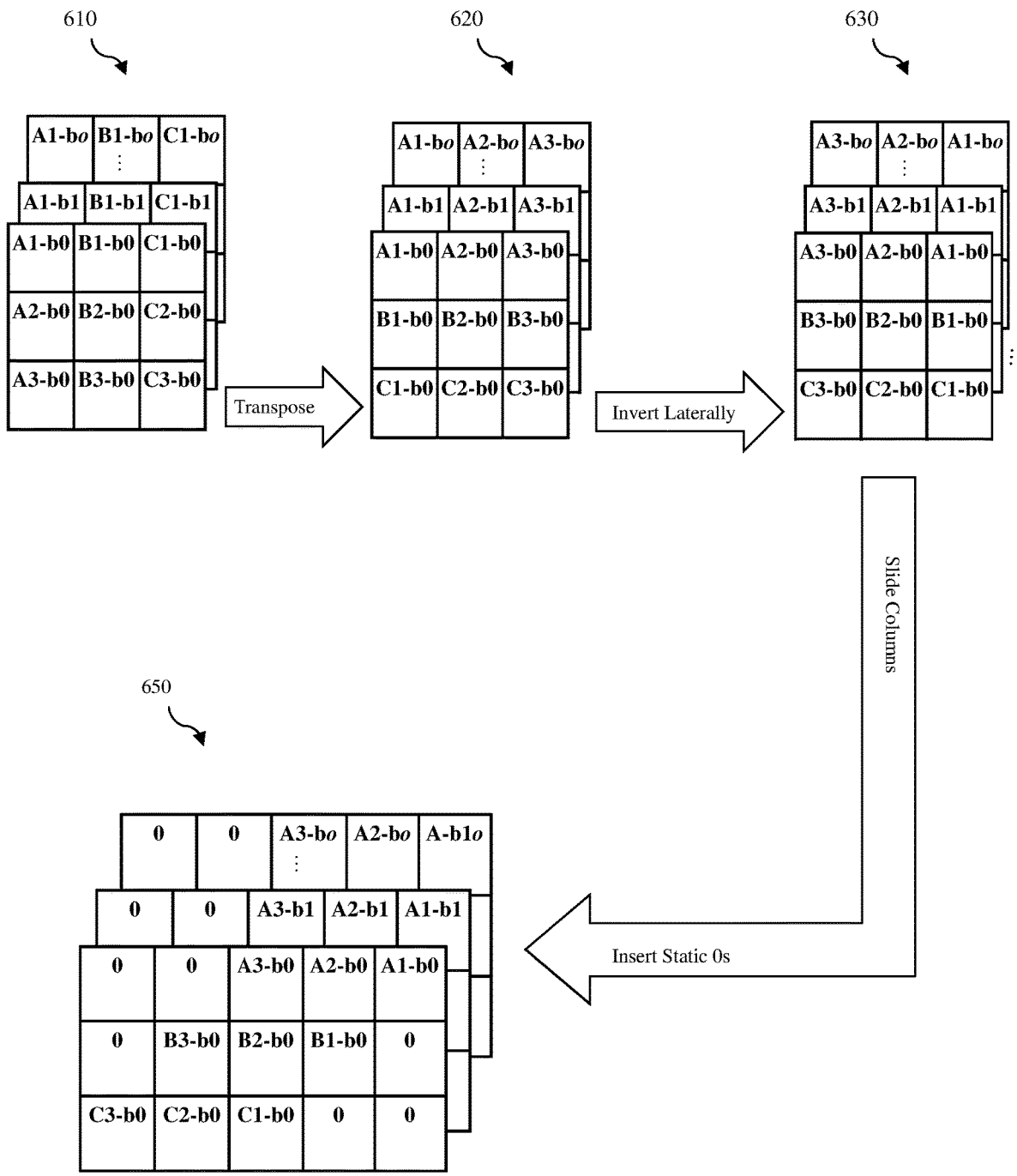
FIG. 6 is a flow chart illustrating the process steps employed to generate a multi-layer data setup matrix for inputting multi-bit data into a systolic array.

FIG. 6 shows an exemplary multi-layer data setup matrix 650. The process steps used to generate this multi-layer data setup matrix 650 will be essentially the same as the process steps described above to generate the single layer data setup matrix 550 but done on a layer-by-layer basis. That is, the process may begin with a three-dimensional data input matrix 620, which m rows, n of columns, and o layers of data input fields, where m is a first number, n is a second number and o is a third number. The same position (i.e., the same column and row address) in the different layers includes multiple bits for a given multi-bit data input (e.g., for multi-bit data A1, b0 is in layer 0, b1 is in layer 1, b2 is in layer 2 and so on). The rows of the data input fields of the data input matrix 620 should be oriented in the same direction as the rows of memory cells in a memory array. Thus, preliminary processing may require an initial data input matrix 610 to be transposed if the row of data input fields are oriented in the X direction (as shown). Next, the data input matrix 620 can be laterally inverted (i.e., flipped horizontally) so that the first row in each layer (e.g., row 1 with A1, B1, C1) is now on the far right side of the laterally inverted matrix 530 and so that the last row (e.g., row 3 with A3, B3, C3) is now on the far left side of the laterally inverted matrix 630. Individual columns within the laterally inverted matrix 630 for each layer can then be slid to generate a torqued matrix 640 with opposing sides that are stepped at the beginnings, ends or beginnings and ends of the n columns. Finally, static zero value input fields can be added to fill in the stepped opposing sides and complete a three-dimensional rectangular-shaped data setup matrix 650. Such a multi-layer (i.e., three dimensional) data setup matrix 650 can be employed when the systolic array is designed to process a series of multi-bit inputs. As a result, each layer of the data setup matrix 650 has ((m+n)−1) rows and n columns of data input fields.

Figure 7:
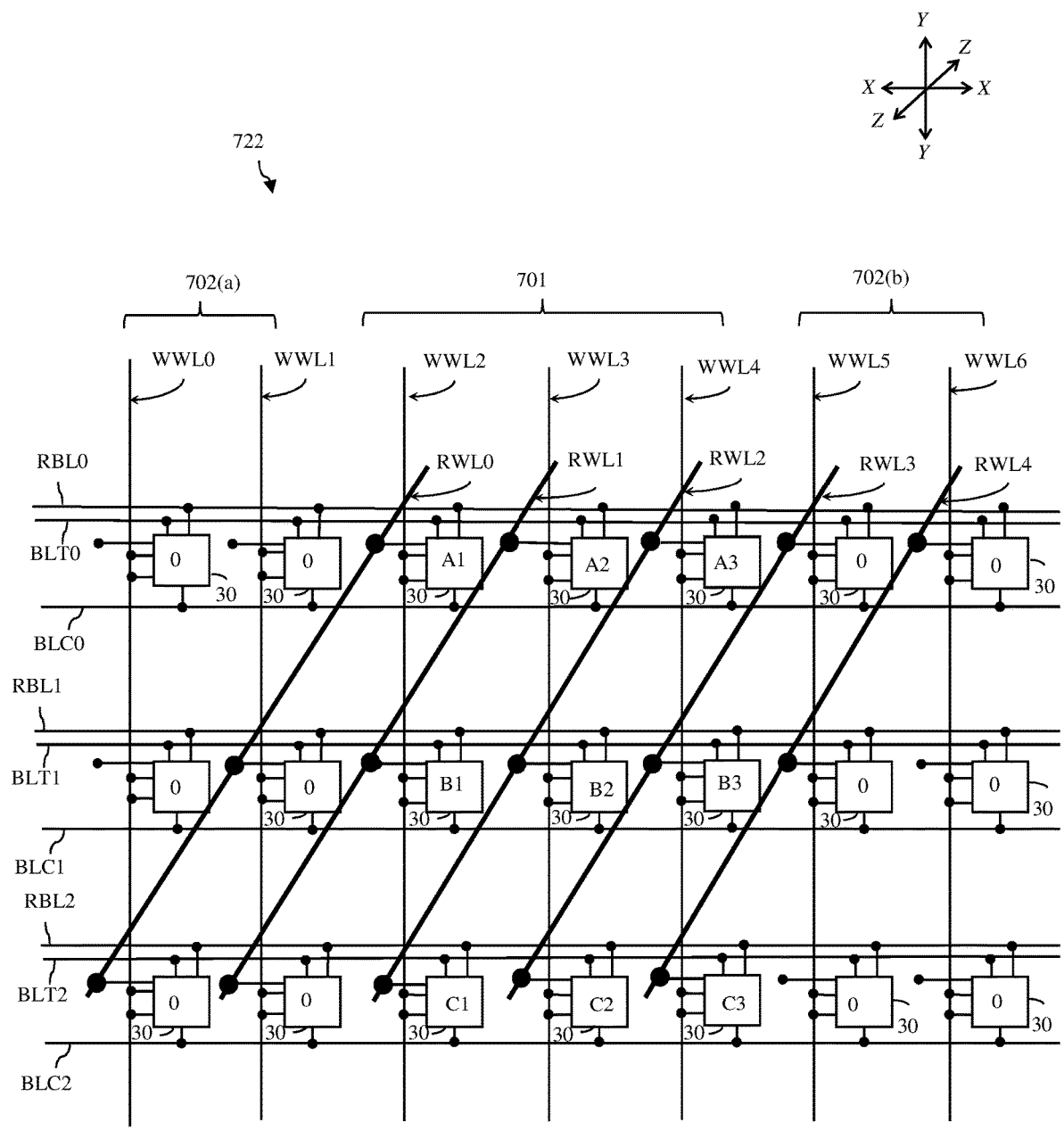
FIGS. 7 and 8 are schematic diagrams each illustrating a memory array that could be incorporated into the memory architecture of FIG. 2 in order to directly feed a series of single-bit inputs into the the systolic array.
Figure 8:
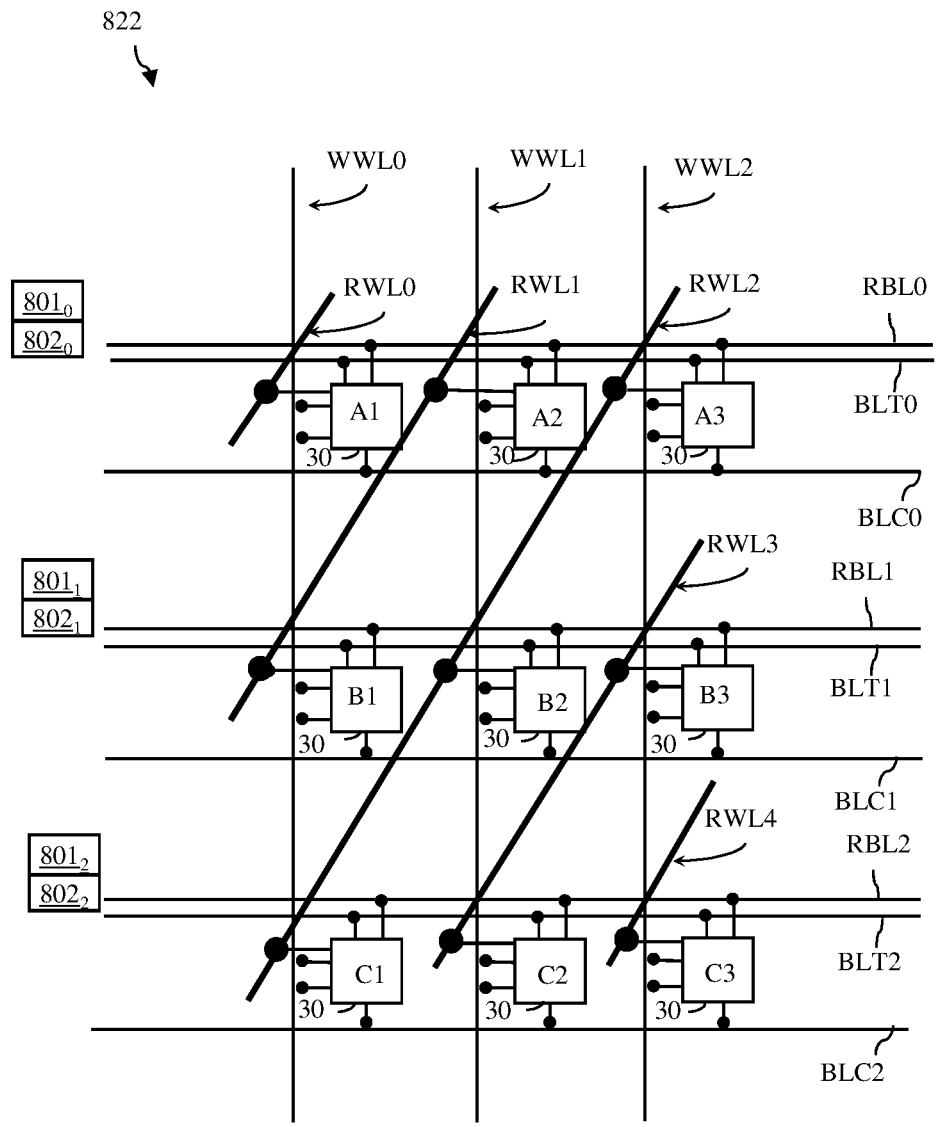

Exemplary memory array(s) 22, which are configured based on the exemplary data input matrix of FIG. 5 and which can be incorporated into the memory architecture 21 in order to directly feed a series of single-bit inputs into the pipeline 24 of the systolic array 23 include memory array 722 of FIG. 7 and memory array 822 of FIG. 8.

One embodiment of a memory architecture 21 that can feed a series of single-bit data directly into a systolic array 23 includes the memory array 722 of FIG. 7. This memory array 722 can include multi-port (MP) memory cells 30 (such as the 2P-SRAM cells 300 of FIG. 3) arranged in columns and rows (as described in paragraph [0032] above). The data input matrix 520 of FIG. 5 has m rows and n columns of data input fields (e.g., 3 rows and 3 columns of data input fields) (as described above in paragraph [0035]). In this embodiment of the memory architecture 21, the memory array 722 can have more rows than the data input matrix 550. Specifically, the memory array 722 can have a center area 701 and side areas 702(a) and 702(b) on opposing sides of the center area 702. The center area 701 can correspond to the data input matrix. That is, it can have m rows and n columns of memory cells (e.g., three rows and three columns of memory cells). Each side area 702(a) and 702(b) can have (m−1) rows and n columns of the memory cells (e.g., 2 rows and 3 columns of memory cells). Thus, as illustrated, the memory array 722 has a total of (2*(m−1)+m) rows and n columns of memory cells (e.g., 7 rows and 3 columns of memory cells). Additionally, the memory array 722 has ((m+n)−1) full diagonals of memory cells (e.g., 5 full diagonals) and, thus, the same number of full diagonals as there are rows of data inputs in the data setup matrix 550.

For purposes of this disclosure, a "diagonal of memory cells" includes one or more memory cells that are diagonally oriented across the memory array. That is, a "diagonal" of memory cells is a group of the memory cells 30 that are linearly aligned in a direction direction that is different from the columns and rows and that is arbitrarily referred to herein as a "diagonal direction", "Z direction", or "third direction". The diagonal direction lies in the same plane as the vertical and horizontal directions, but the diagonal direction is not parallel to, or perpendicular to, either the vertical or the horizontal directions. Instead, the diagonal direction is between, for example, 5 degrees and 85 degrees of parallel to either the vertical or the horizontal directions; and in one example, the diagonal direction can be at 45 degrees to the vertical and/or the horizontal directions. The diagonals of memory cells are parallel to, and space apart from, each other. In greater detail, each immediately successive memory cell 30 of a diagonal is within an immediately adjacent row and an immediately adjacent column relative to each immediately preceding memory cell 30 of that diagonal. In other words, each successive memory cell 30 in each diagonal is physically positioned in the very next row and very next column, causing the memory cells 30 within the diagonals to be aligned in the diagonal direction that linearly crosses the columns and the rows.

A memory array contains one or more "full diagonals" of memory cells and two or more "partial diagonals" of memory cells. Each full diagonal of memory cells includes memory cells from n immediately adjacent rows with one memory cell from each of the n columns. Each partial diagonal of memory cells includes memory cells in one or more adjacent rows at opposite corners of the memory array and, thus, will not contain memory cells from each of the n columns. The numbers of full and partial diagonals depends upon the number m of rows of memory cells and the number n of columns of memory cells within the memory array. For example, when the number n of columns of memory cells equals two, the number of partial diagonals of memory cells within the memory array will be two and will include only a first diagonal in the upper left corner with a single memory cell from the first column/first row and a last diagonal in the lower right corner with a single memory cell from the third (last) column/last row. When the number n of columns of memory cells equals three (e.g., as illustrated in the exemplary memory array 722 shown in FIG. 7), the number of partial diagonals of memory cells will be four and will include a first diagonal in the upper left corner with a single memory cell from the first column/first row, a second diagonal in the upper left corner with memory cells from the second column/first row and first column/second row, a last diagonal in the lower right corner with a single memory cell from the third (last) column/last row, and a second to last diagonal in the lower right corner with memory cells from the third (last) column/second to last row and from the second column/last row. Each full diagonal is between the partial diagonals. Thus, in the exemplary memory array 722 shown in FIG. 7, when m equals 7, there will be five full diagonals of memory cells between the partial diagonals of memory cells in the upper left and bottom right corners.

Referring again to the embodiment shown in FIG. 7, the memory architecture 21 further includes a second read wordline for each full diagonal. Thus, given the total of (2*(m−1)+m) rows, n columns, and ((m+n)−1) full diagonals of memory cells in the memory array 722, the memory architecture includes 2*(m−1)+m) first wordlines (e.g., 7 first wordlines, see WWL0-WWL6) with each of the 2*(m−1)+m) first wordlines being connected to all of the n memory cells in a corresponding one of the 2*(m−1)+m) rows to enable the first port write operations and ((m+n)−1) second wordlines (e.g., 5 second wordlines, see RWL0-RWL4) with each of the ((m+n)−1) second wordlines being connected to all of the n memory cells in a corresponding one of the ((m+n)−1) full diagonals to enable the second port read operations. Thus, in this embodiment, the write address wordlines space is larger than the read address wordline space.

In operation, the controller 26 can cause first port write operations to be performed using the first wordlines (e.g., WWL0-WWL6) and, during the first port write operations, can cause zero data values to be written to all memory cell addresses in the side areas 702(a)-702(b) and can further cause the data input values from the data input matrix 520 to be written to corresponding memory cell addresses in the center area 701, as illustrated. Following the first port write operations, the controller 26 can cause second port read operations to be performed in a predetermined sequence using the diagonally oriented second wordlines (e.g., RWL0 through RWL4 in sequence) such that the data outputs from the memory architecture 21 are in the proper order, as specified by the data input matrix 550. That is, referring to the data setup matrix 550, the proper order is as follows: the first row on the far right side that includes A1, 0, 0; the adjacent row that includes A2, B1, 0; and so on. In this case, the second port read operations can begin by activating RWL0 (i.e., switching the voltage level of RWL0 to a logic "1") in order to read out the data value for A1 stored in the first memory cell of the third row, followed by a static zero value stored in the second memory cell of the second row; and then a static zero value stored in the third memory cell of the first row. Next, RWL1 can be activated (i.e., by switching the voltage level of RWL1 to a logic "1") in order to read out the the data value for A2 stored in the first memory cell of the fourth row, followed by the data value for B1 stored in the second memory cell of the third row, and then a static zero value stored in the third memory cell of the second row; and so on.

Another embodiment of a memory architecture 21 that can feed a series of single-bit data directly into the systolic array 23 includes the memory array 822 of FIG. 8. This memory array 822 can include multi-port (MP) memory cells 30 (such as the 2P-SRAM cells 300 of FIG. 3) arranged in columns and rows. In this embodiment, the memory array 822 corresponds to the data input matrix (i.e., the numbers of columns and rows of memory cells in the memory array 822 match the numbers of columns and rows of data input fields in the data input matrix 522). Thus, the memory array 822 has m rows and n columns of memory cells (e.g., three rows and three columns of memory cells). Additionally, the total number of diagonals (including both partial and full diagonals) is ((m+n)−1), which, as mentioned above, is the same number of rows of data inputs in the data setup matrix 550.

In this embodiment, the memory architecture 21 further includes second wordlines for each diagonal (i.e., for the first diagonal through the last diagonal). Given the total of (2*(m−1)+m) rows, n columns, and ((m+n)−1) diagonals of memory cells in the memory array 822, the memory architecture includes m first wordlines (e.g., 3 first wordlines, see WWL0-WWL2) with each of the m first wordlines being connected to all of the n memory cells in a corresponding one of the m rows to enable the first port write operations and ((m+n)−1) second wordlines (e.g., 5 second wordlines, see RWL0-RWL4) with each of the ((m+n)−1) second wordlines being connected to all of the n (or fewer) memory cells in a corresponding one of the ((m+n)−1) diagonals to enable the second port read operations. Thus, in this embodiment the write address wordlines space is smaller than the read address wordline space.

In operation, the controller 26 can cause first port write operations to be performed using the first wordlines (e.g., WWL0-WWL2) and, during the first port write operations, can cause the data input values from the data input matrix 520 to be written to corresponding memory cell addresses in the memory array 822, as illustrated. Following the first port write operations, the controller 26 can cause second port read operations to be performed in a predetermined sequence using the diagonally oriented second wordlines (e.g., RWL0 through RWL4 in sequence). However, since the memory array 822 does not include the additional rows for storing the static zero values to match the static zero values in the data setup matrix 550, additional circuitry (including read data mask generators $801_0$-$801_2$ and data output selectors $802_0$-$802_2$) is included in the output blocks for the columns to ensure that the series of single-bit data, which is read out by the memory architecture 21, is correct and in the proper order for being processed by the systolic array 23 (as specified by the data input matrix 550 of FIG. 5).

Specifically, each read data mask generator is a unique logic circuit for a given column, is configured to receive, from the controller 26, the binary name (i.e., bit word) corresponding to the currently activate second wordline (e.g., corresponding to RWL0, RWL1, RWL2, RWL3 or RWL4) during the second port read operations and, given that activate second wordline, to generate either a read data mask with a logic value of 1 or a 0 to control a corresponding data output selector. A read data mask of 0 can be applied to the corresponding data output selector to force an actual stored data value from a memory cell (i.e., a 1 or 0 stored data value) to be output, whereas a read data mask of 1 can be applied to the corresponding data output selector to force a dummy 0 data value to be output. Thus, for example, the data setup matrix 550 specifies that the proper order for data input values to the systolic array is as follows: A1, 0, 0 (see the first row on the far right side); A2, B1, 0 (see the adjacent row); and so on. However, as illustrated in FIG. 8, RWL0 is only connected the first memory cell in the first row that stores the data value for A1, but it is not connected to any memory cells in any other rows that store static zero values (e.g., as in the memory array 722 of FIG. 7 described above); RWL1 is only connected to the first memory cell that stores the data value for A2 in the second row and to the second memory cell that stores the data value for B1 in the first row, but it is not connected to any other memory cells that store a static zero value (e.g., as in the memory array 722 of FIG. 7); and so on. Thus, the read data mask generators $801_0$-$801_2$ for the different columns in the memory array 822 of FIG. 8 will be custom configured such that each read data mask generator $801_0$-$801_2$ follows a specific truth table that defines the output of the read data mask generated as a function of which of the second wordlines (i.e., RWL0, RWL1, etc.) is currently active.

For example, FIG. 9 is a table showing the truth tables for the outputs of the three read data mask generators $801_0$-$801_2$ (identified in the columns, respectively) as a function of which of the read word lines RWL0-RWL4 (identified in the rows, respectively) is currently active. It should be noted that in this table the rows are identified not only by RWL0-RWL4 but also by the binary address (also referred to herein as the binary name) each having three bits identified by positions AW<0>, AW<1> and AW<2>. The custom logic circuits for the three read data mask generators $801_0$-$801_2$ can be configured so that the desired output (i.e., read data mask of 1 or 0) is output by that read data mask generator in response to all or specific ones of the AW bits indicating which one of the read word lines is active. As indicated by the table, when RWL0 is active such that each read data mask generator $801_0$-$801_2$ receives all or a portion of the binary address (also referred to herein as the binary name) with AW bits <2>=0, <1>=0, and <0>=0 corresponding to RWL0, then the first read data mask generator $801_0$ for the first column will generate a 0 value read data mask, thereby causing the corresponding data output selector $802_0$ to feed the stored data value from A1 out to the systolic array and the read data mask generators $801_1$ and $801_2$ for the second and third columns, respectively, will generate 1 value read data masks, thereby causing the corresponding data output selectors $802_1$-$802_2$ to feed out zero data values to the systolic array. When RWL1 is active such the each read data mask generator $801_0$-$801_2$ receives all or a portion of the binary address with AW bits <2>=0, <1>=0, and <0>=1 associated with RWL1, read data mask generator $801_0$ and $801_1$ for the first and second columns will generate 0 value read data masks, thereby causing the corresponding data output selectors $802_0$ and $802_1$ to feed the stored data values from A2 and B1, respectively, to the systolic array, whereas the read data mask generators $801_1$ and $801_2$ for the second and third columns will generate 1 value read data masks, thereby causing the corresponding data output selectors $802_1$-$802_2$ to feed zero data values to the systolic array. When RWL2 is active such the each read data mask generator $801_0$-$801_2$ receives the binary address with AW bits <2>=0, <1>=1, and <0>=0 associated with RWL2, all of the read data mask generators $801_0$-$801_2$ for all of the columns will generate 0 value read data masks, thereby causing the corresponding data output selectors $802_0$-$802_2$ to feed the stored data values from A3, B2, C1, respectively, to the systolic array. When RWL3 is active such the each read data mask generator receives the binary address with AW bits <2>=0, <1>=1, and <0>=1 associated with RWL3, the read data mask generator $801_0$ for the first column will generate a 1 value read data mask, thereby causing the corresponding data output selectors $802_0$ to feed a zero data value to the systolic array, whereas the read data mask generators $801_1$ and $801_2$ for the second and third columns will generate 0 value read data masks, thereby causing the corresponding data output selectors $802_1$-$802_2$ to feed the stored data values from B3 and C2 to the systolic array. Finally, when RWL4 is active such the each read data mask generator $801_0$-$801_2$ receives the binary address with AW bits <2>=1, <1>=0, and <0>=1 associated with RWL4, the read data mask generators $801_0$-$801_1$ for the first column and the second column, respectively, will generate 1 value read data masks, thereby causing the corresponding data output selectors $802_0$-$802_2$ to feed zero data values to the systolic array, whereas the read data mask generator $801_2$ for the third column will generate a 0 value read data mask, thereby causing the corresponding data output selector $802_2$ to feed the stored data value from C3 to the systolic array.

FIGS. 10A-10C are schematic diagrams illustrating exemplary custom logic circuits suitable for use as the read data mask generators $802_0$-$802_1$, respectively. More specifically, consider the read data mask generator $801_0$, which as indicated by the table of FIG. 9, should output 0 value read data masks (causing stored data to be fed to the systolic array) whenever RWL0, RWL1 and RWL2 are active and should output 1 value read data masks (causing zero data values to be fed to the systolic array) whenever RWL3 and RWL4 are active. FIG. 10A is an exemplary custom logic circuit suitable for achieving these desired outputs in response to the AW bits of the active read word lines. Specifically, the read data mask generator $801_0$ of FIG. 10A includes a NAND gate 1001, a first inverter 1002, a NOR gate 1003 and a second inverter 1004. The inputs to the NAND gate 1001 are AW<0> and AW<1>. The input to the first inverter 1002 is the output from the NAND gate 1001. The input to the NOR gate 1003 are the output from the first inverter 1002 and AW<2>. The input to the second inverter 1004 is the output from the NOR gate 1003 and the final output (i.e., the read data mask) from this read data mask generator $801_0$ is the output from the second inverter 1004. Thus, when RWL0 is active the read data mask generator $801_0$ operates as follows: the input to the NAND gate 1001 is 0,0 and the output is 1; the input to the first inverter 1002 is 1 and the output is 0; the inputs to the NOR gate 1003 are 0, 0 and the output is 1; and the input to the second inverter 1004 is 1 such that the final output is 0. When RWL1 is active the read data mask generator $801_0$ operates as follows: the input to the NAND gate 1001 is 1,0 and the output is 1; the input to the first inverter 1002 is 1 and the output is 0; the inputs to the NOR gate 1003 are 0, 0 and the output is 1; and the input to the second inverter 1004 is 1 such that the final output is 0. When RWL2 is active the read data mask generator $801_0$ operates as follows: the input to the NAND gate 1001 is 1,0 and the output is 1; the input to the first inverter 1002 is 1 and the output is 0; the inputs to the NOR gate 1003 are 0, 0 and the output is 1; and the input to the second inverter 1004 is 1 such that the final output is 0. When RWL3 is active the read data mask generator $801_0$ operates as follows: the input to the NAND gate 1001 is 1,1 and the output is 0; the input to the first inverter 1002 is 0 and the output is 1; the inputs to the NOR gate 1003 are 1, 0 and the output is 0; and the input to the second inverter 1004 is 0 such that the final output is 1. Finally, when RWL4 is active the read data mask generator $801_0$ operates as follows: the input to the NAND gate 1001 is 0,0 and the output is 1; the input to the first inverter 1002 is 1 and the output is 0; the inputs to the NOR gate 1003 are 0, 1 and the output is 0; and the input to the second inverter 1004 is 0 such that the final output is 1.

Consider the read data mask generator $801_1$, which as indicated by the table of FIG. 9, should output 0 value read data masks (causing stored data to be fed to the systolic array) whenever RWL1, RWL2 and RWL3 are active and should output 1 value read data masks (causing zero data values to be fed to the systolic array) whenever RWL0 and RWL4 are active. FIG. 10B is an exemplary custom logic circuit suitable for achieving these desired outputs in response to the AW bits of the active read word lines. Specifically, the read data mask generator $801_1$ of FIG. 10B simply includes a NOR gate 1011 with the inputs to the NOR gate 1011 being AW<0> and AW<1> (not AW<2>). The final output (i.e., the read data mask) of the read data mask generator $801_1$ is the output of this NOR gate 1011. When RWL0 is active, the inputs to the NOR gate 1011 are 0,0 and the output is 1. When RWL1 is active, the inputs to the NOR gate 1011 are 1,0 and the output is 0. When RWL2 is active, the inputs to the NOR gate 1011 are 0,1 and the output is 0. When RWL3 is active, the inputs to the NOR gate 1011 are 1,1 and the output is 0. When RWL4 is active, the inputs to the NOR gate 1011 are 0,0 and the output is 1.

Finally, consider the read data mask generator $801_2$, which as indicated by the table of FIG. 9, should output 0 value read data masks (causing stored data to be fed to the systolic array) whenever RWL2, RWL3 and RWL4 are active and should output 1 value read data masks (causing zero data values to be fed to the systolic array) whenever RWL0 and RWL1 are active. FIG. 10C is an exemplary custom logic circuit suitable for achieving these desired outputs in response to the AW bits of the active read word lines. Specifically, like the read data mask generator $801_1$ of FIG. 10B, the read data mask generator $801_2$ of FIG. 10C includes a NOR gate 1021 but in this case the inputs to the NOR gate are AW<1> and AW<2> (not AW<0>). The final output (i.e., the read data mask) of the read data mask generator $801_2$ is the output of this NOR gate 1021. When RWL0 is active, the inputs to the NOR gate 1021 are 0,0 and the output is 1. When RWL1 is active, the inputs to the NOR gate 1021 are 0,0 and the output is 1. When RWL2 is active, the inputs to the NOR gate 1021 are 1,0 and the output is 0. When RWL3 is active, the inputs to the NOR gate 1021 are 1,0 and the output is 0. When RWL4 is active, the inputs to the NOR gate 1011 are 0,1 and the output is 0.

It should be noted that custom logic configurations shown in FIGS. 10A-10C are shown for illustration purposes and that they are not intended to be limiting. Alternatively, other custom logic configurations could be employed. Such custom configurations can be determined manually by a designer or through simulations.

Figure 11:
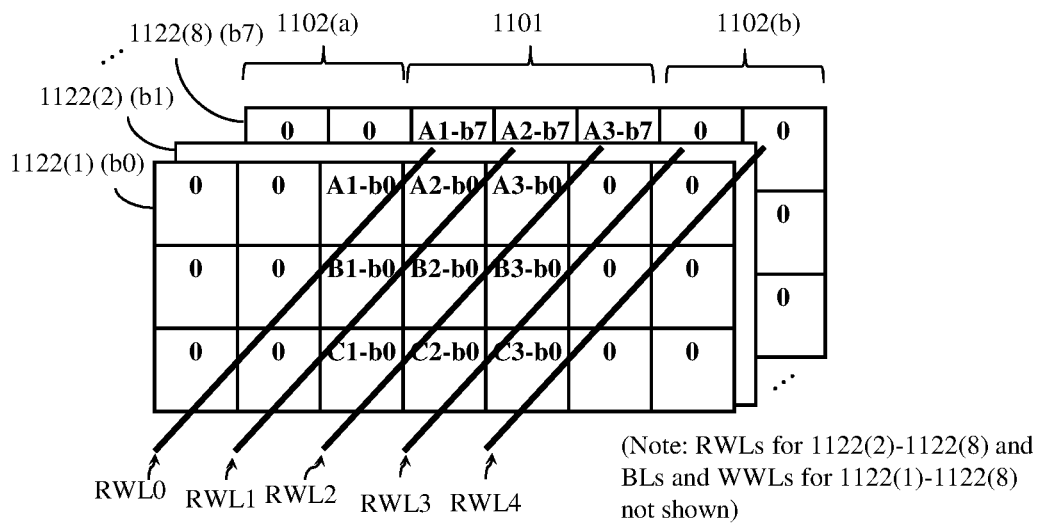
FIGS. 11 and 12 are schematic diagrams each illustrating multiple memory arrays that could be incorporated into the memory architecture of FIG. 2 with each memory array generating a series of single-bit inputs that can be combined so as to directly feed a series of multi-bit inputs into the the systolic array.
Figure 12:
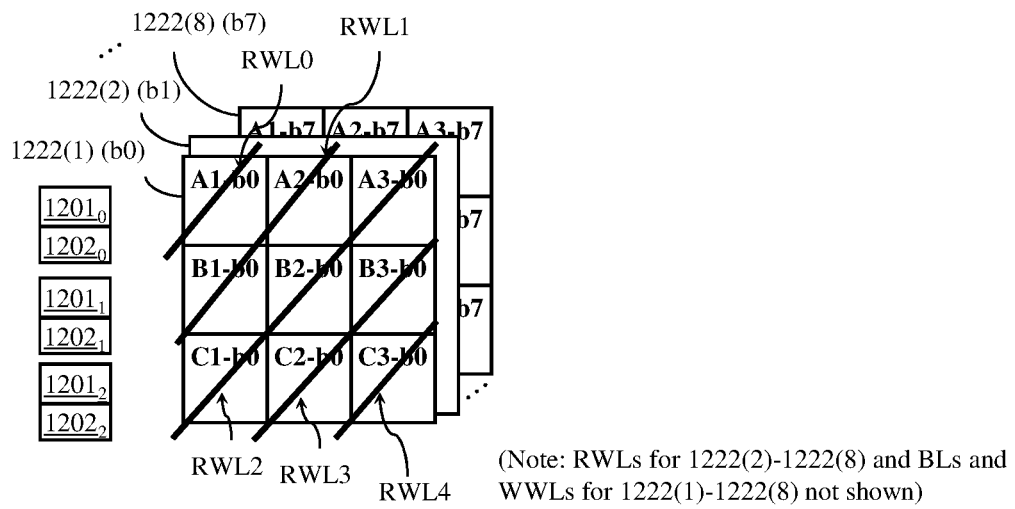
Figure 14:
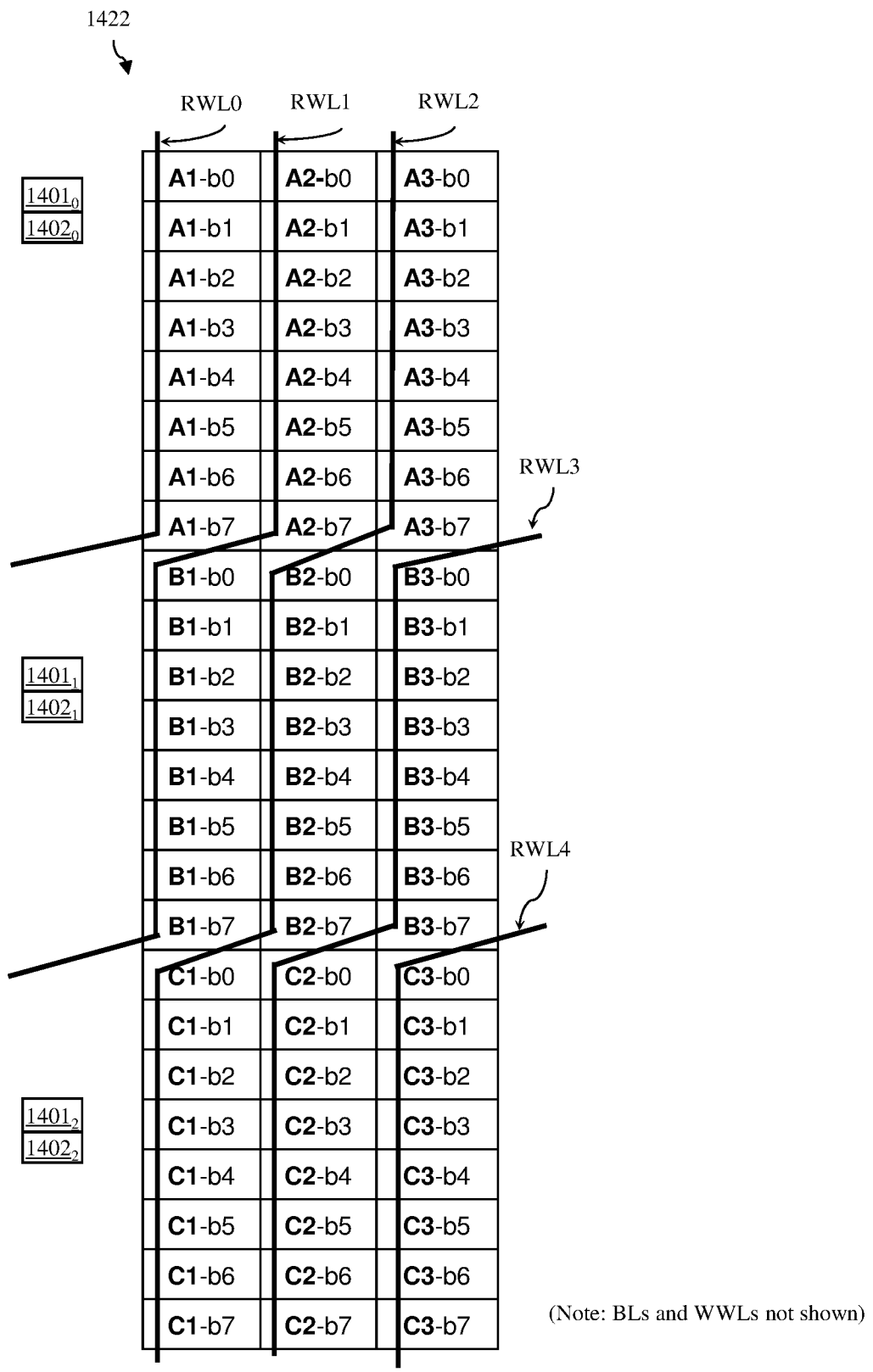
Figure 16:
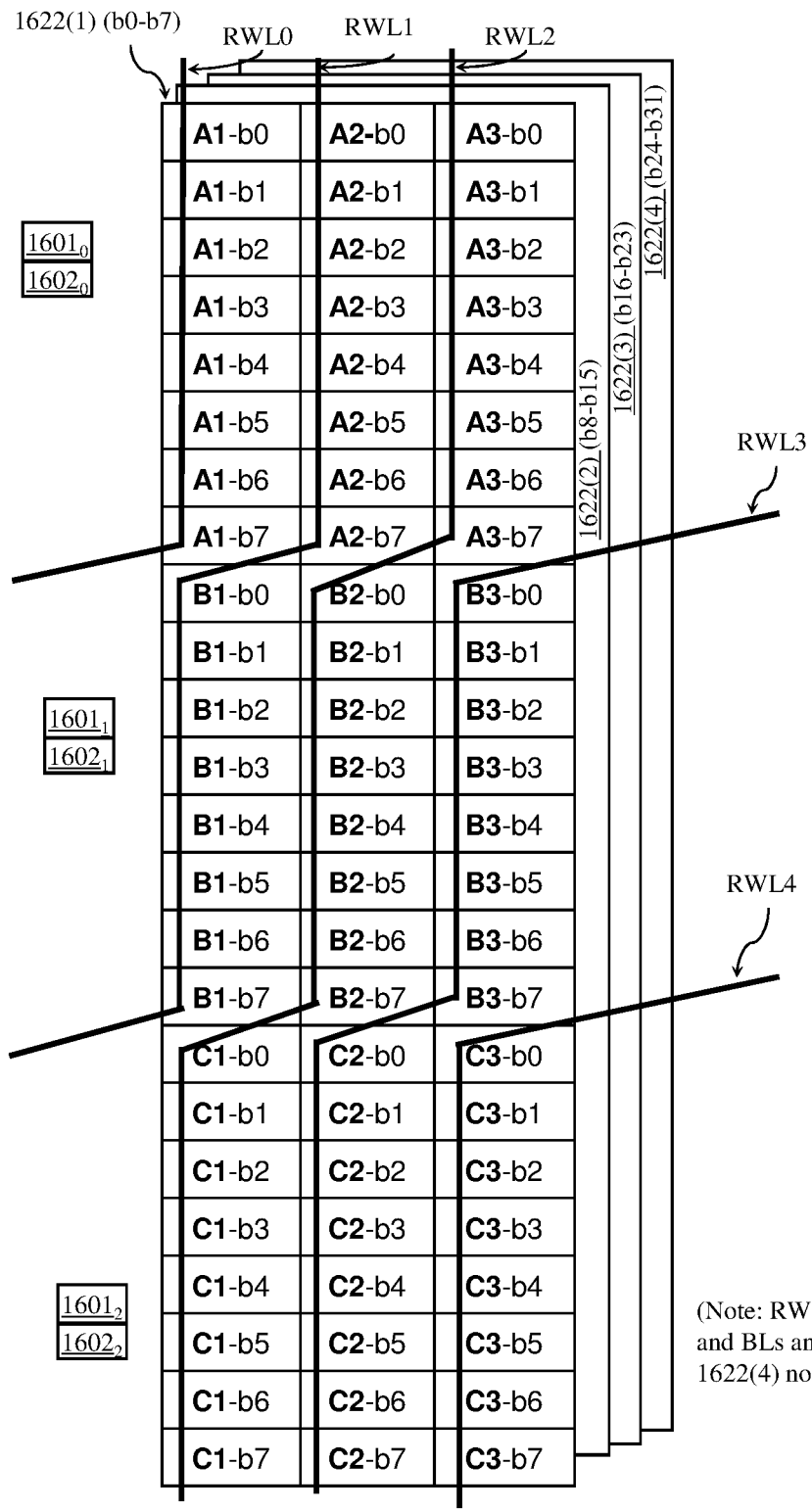

Exemplary memory array(s) 22, which are configured based on the exemplary data input matrix 620 of FIG. 6 and which can be incorporated into the memory architecture 21 in order to directly feed a series of multi-bit data into the pipeline 24 of the systolic array 23 include the following: memory arrays 1122(1)-(8) of FIG. 11, memory arrays 1222(1)-(8) of FIG. 12, memory array 1322 of FIG. 13, memory array 1422 of FIG. 14, memory arrays 1522(1)-(4) of FIG. 15 and memory arrays 1622(1)-(4) of FIG. 16.

More specifically, one embodiment of a memory architecture 21 that can feed a series of multi-bit data directly into a systolic array 23 includes multiple memory arrays 1122(1)-1122(8), as shown in FIG. 11. For purposes of illustration, eight memory arrays are shown in the figures and described below. However, it should be understood that the number of memory arrays 1122 is not intended to be limiting. Alternatively, the memory architecture 21 can include any number of two or more memory arrays 1122 depending upon the desired size of the multi-bit outputs, as discussed below.

In any case, each memory array 1122(1)-1122(8) can include multi-port (MP) memory cells 30 (such as the 2P-SRAM cells 300 of FIG. 3) arranged in columns and rows. Additionally, each memory array 1122(1)-1122(8) can be configured in essentially the same manner as the memory array 722, described in detail above and illustrated in FIG. 7, except that each one of the memory arrays 1122(1)-1122(8) is configured based on a corresponding one of the layers of the data input matrix 620 of FIG. 6. Specifically, each memory array 1122(1)-1122(8) has a center area 1101 with m rows and n columns memory cells and side areas 1102(*a*)-1102(*b*) on opposing sides of the center area 1101 and each having (m−1) rows and n columns of memory cells.

In operation, the controller 26 can cause first port write operations to be performed in each of the memory arrays 1122(1)-1122(8) using the first wordlines (e.g., WWL0-WWL6) for each array and, during the first port write operations, can cause zero data values to be written to all memory cell addresses in the side areas 1102(*a*)-1102(*b*) of each memory array 1122(1)-1122(8) and can further cause the m by n data input values from each of the layers of the data input matrix 620 to be written to corresponding memory cell addresses in the center areas 1101 of the memory arrays 1122(1)-1122(8), respectively. Following the first port write operations, the controller 26 can cause second port read operations to be performed in a predetermined sequence, in parallel, in each of the memory arrays 1122(1)-1122(8) using the diagonally oriented second wordlines (e.g., RWL0 through RWL4 in sequence) such that multiple series of single-bit outputs from the multiple memory arrays 1122(1)-1122(8), respectively, are combined into a single series of multi-bit outputs and such that the resulting multi-bit outputs are correct and in the proper order, as specified by the data setup matrix 650, for being processed by the systolic array 23. As with the second wordlines for the memory array 722 of FIG. 7, the second wordlines for each memory array 1122(1)-1122(8) are connected to all of the memory cells in a corresponding one of the full diagonals to enable the second port read operations.

Another embodiment of a memory architecture 21 that can feed a series of multi-bit data directly into a systolic array 23 includes multiple memory arrays 1222(1)-1222(8), as shown in FIG. 12. For purposes of illustration, eight memory arrays are shown in the figures and described below. However, it should be understood that the number of memory arrays 1222 is not intended to be limiting. Alternatively, the memory architecture 21 can include any number of two or more memory arrays 1222 depending upon the desired size of the multi-bit outputs, as discussed below.

In any case, each memory array 1222(1)-1222(8) can include multi-port (MP) memory cells 30 (such as the 2P-SRAM cells 300 of FIG. 3) arranged in columns and rows. Additionally, each memory array 1222(1)-1222(8) can be configured in essentially the same manner as the memory array 822, described in detail above and illustrated in FIG. 8, except that each one of the memory arrays 1222(1)-1222(8) is configured based on a corresponding one of the layers of the data input matrix 620 of FIG. 6. Thus, each memory array 1222(1)-1222(8) can have m rows and n columns of memory cells and, for each memory array 1222(1)-1222(8), the memory architecture can further include read data mask generators 1201$_0$-1201$_2$ and data output selectors 1202$_0$-1201$_2$ for each column of each memory array 1222(1)-1222(8).

In operation, the controller 26 can cause first port write operations to be performed in the memory arrays 1222(1)-1222(8) using the first wordlines (e.g., WWL0-WWL2) for each array and, during the first port write operations, can cause the m by n data input values from each layer of the data input matrix 620 to be written to corresponding memory cell addresses in the memory arrays 1222(1)-1222(8), respectively. Following the first port write operations, the controller 26 can cause second port read operations to be performed in a predetermined sequence, in parallel, in each of the memory arrays 1222(1)-1222(8) using diagonally oriented second wordlines (e.g., RWL0 through RWL4 in sequence), which are connected to all of the MP memory cells in each diagonal of memory cells, respectively. As with the memory array 822 of FIG. 8, since the memory arrays 1222(1)-1222(8) do not include additional rows for storing static zero values to match the static zero values in the data setup matrix 650, additional circuitry (including the read data mask generators 1201$_0$-1201$_2$ and data output selectors 1202$_0$-1202$_2$) is included in the output blocks for the columns to insert the zero data values, when necessary (i.e., in the same manner as described above with respect to the memory array 822 of FIG. 8). As a result, the series of single-bit outputs that are read out from the memory arrays 1222(1)-1222(8), respectively, are correct and in the proper order, thereby ensuring that, when the series of single-bit inputs from the memory arrays are combined at the output of the memory architecture 21 into a series of multi-bit outputs, that series of multi-bit outputs is correct and in the proper order for being processed by the systolic array 23, as specified by the data setup matrix 650.

Yet another embodiment of a memory architecture 21 that can feed a series of multi-bit data directly into a systolic array 23 includes the single memory array 1322 of FIG. 13. The memory array 1322 can include multi-port (MP) memory cells 30 (such as the 2P-SRAM cells 330 of FIG. 3) arranged in columns and rows. In this embodiment, the memory array 1322 can have more rows and more columns than the data input matrix 620. Specifically, the memory array 1322 can have a center area 1301 and side areas 1302(*a*) and 1302(*b*) on opposing sides of the center area 1302. The center area 1301 can have the same number m of rows as the data input matrix (e.g., 3 rows) and n times o columns (e.g., 24 columns). More specifically, in this embodiment, each row of memory cells of the center area of the memory array 1322 can include multiple sets of memory cells and each set can include memory cells that corresponds to the data input fields found at the same position in each layer of the data input matrix. That is, as mentioned above, the same positions (i.e., the same column and row addresses) from each layer of the data input matrix 620 correspond to different bits (e.g., b0, b1, b2, b3, b4, b5, b6, b7) of a given multi-bit data input value (e.g., 8-bit data input value) for A1, B1, C1, A2, B2, C2, A3, B3, and C3. Instead of the center area 1301 of the memory array 1322 being an m by n array of memory cells for storing single-bit data values for A1, B1, C1 etc., as in the memory array 722 of FIG. 7, the center area 1301 of memory array 1322 includes an m by n array of memory cell sets with each set having memory cells for storing all of the bits b0-b7 for a given multi-bit data value (e.g., for A1, B1, C1, etc.) and each row having n memory cell sets (with o memory cells each). Each side area 1302(a) and 1302(b) can have (m−1) rows and the same number of columns of memory cells as the center area (e.g., 2 rows and 24 columns of memory cells). Thus, as illustrated, the memory array 1322 has a total of (2*(m−1)+m) rows and n×o columns of memory cells (e.g., 7 rows and 24 columns of memory cells). Thus, the memory array 1322 has ((m+n)−1) full diagonals of memory cell sets (e.g., 5 full diagonals of memory cell sets).

For purposes of this disclosure, a "diagonal of memory cell sets" includes one or more memory cell sets (which include a same number of memory cells each) that are diagonally oriented across the memory array. That is, a "diagonal" of memory cell sets is a group of sets of memory cells, where the sets of memory cells in the group are linearly aligned in a direction direction that is different from the columns and rows of memory cells and that is arbitrarily referred to herein as a "diagonal direction", "Z direction", or "third direction". The diagonal direction lies in the same plane as the vertical and horizontal directions, but the diagonal direction is not parallel to, or perpendicular to, either the vertical or the horizontal directions. Instead, the diagonal direction is between, for example, 5 degrees and 85 degrees of parallel to either the vertical or the horizontal directions; and in one example, the diagonal direction can be at 45 degrees to the vertical and/or the horizontal directions. The diagonals of memory cell sets are parallel to, and space apart from, each other. In greater detail, each immediately successive memory cell sett of a diagonal is within an immediately adjacent row and an immediately adjacent column relative to each immediately preceding memory cell set of that diagonal. In other words, each successive memory cell set in each diagonal is physically positioned in the very next row and very next column, causing the memory cell sets within the diagonals to be aligned in the diagonal direction that linearly crosses the columns and the rows.

In the embodiment shown in FIG. 13 (as well as in the embodiments shown in FIGS. 14-16, discussed below), the memory array contains one or more "full diagonals" of memory cell sets and two or more "partial diagonals" of memory cell sets. Each full diagonal of memory cell sets includes memory cell sets from n immediately adjacent rows with one memory cell set from each of the n columns and with each set having o memory cells. Each partial diagonal of memory cell sets includes memory cell sets in one or more adjacent rows at opposite corners of the memory array and, thus, will not contain memory cell sets from each of the n columns. The numbers of full and partial diagonals of memory cell sets depends upon the number of rows of memory cells and the number of memory cell sets per row. For example, when the number of memory cell sets per row equals two, the number of partial diagonals of memory cell sets within the memory array will be two and will include only a first diagonal in the upper left corner with a single memory cell set from the first o columns/first row and a last diagonal in the lower right corner with a single memory cell set from a third o columns/last row. When the number of memory cell sets per row equals three (e.g., as illustrated in the exemplary memory array 1322 shown in FIG. 13), the number of partial diagonals of memory cell sets will be four and will include a first diagonal in the upper left corner with a single memory cell set from the first o columns/first row, a second diagonal in the upper left corner with memory cell sets from the second o columns/first row and the first o columns/second row, a last diagonal in the lower right corner with a single memory cell set from the third o columns/last row, and a second to last diagonal in the lower right corner with memory cell sets from the third o columns/second to last row and from the second o columns/last row. Each full diagonal is between the partial diagonals. Thus, in the exemplary memory array 1322 shown in FIG. 13, there are five full diagonals of memory cell sets between the partial diagonals of memory cell sets in the upper left and bottom right corners.

Referring again to the embodiment shown in FIG. 13, the memory architecture 21 further includes a second read wordline for each full diagonal of memory cell sets. Thus, given the total of (2*(m−1)+m) rows, n×o columns, and ((m+n)−1) full diagonals of memory cell sets in the memory array 1322, the memory architecture 21 includes 2*(m−1)+m) first wordlines (which are not shown in FIG. 13 in order to avoid clutter and allow the reader to focus on the salient aspects of the disclosed embodiment) with each of the 2*(m−1)+m) first wordlines being connected to all of the n×o memory cells in a corresponding one of the 2*(m−1)+m) rows to enable the first port write operations. This memory architecture embodiment also includes ((m+n)−1) second wordlines (e.g., 5 second wordlines, see RWL0-RWL4) with each of the ((m+n)−1) second wordlines being connected to all of the memory cells in all of the n memory cell sets in a corresponding one of the ((m+n)−1) full diagonals of memory cell sets to enable the second port read operations. Thus, as illustrated, the second wordlines are stepped with portions oriented in both the Y direction (i.e., the same directions as the rows) along a given memory cell set and diagonally across to an adjacent row and another, lower, memory cell set.

In operation, the controller 26 can cause first port write operations to be performed using the first wordlines and, during the first port write operations, can cause zero data values to be written to all memory cell addresses in the side areas 1302(a)-1302(b) and can further cause the data input values from the data input matrix 620 to be written to corresponding memory cell addresses in the center area 1301, as indicated. Following the first port write operations, the controller 26 can cause second port read operations to be performed in a predetermined sequence using the stepped second wordlines (e.g., RWL0 through RWL4 in sequence) such that the data outputs from the memory architecture 21 are in the proper order, as specified by the data setup matrix 650. The second port read operations can begin by activating RWL0 (i.e., switching the voltage level of RWL0 to a logic "1") to read out, in sequence, the data values for the A1 bits b0-b7 stored in memory cells 0-7 of the third row, followed by static zero values stored in memory cells 8-15 in the second row, and then static zero values stored in memory cells 16-23 of the first row. Next, RWL1 can be activated (i.e., by switching the voltage level of RWL1 to a logic "1") to read out, in sequence, the data values for A2 bits b0-b7 stored in memory cells 0-7 in the fourth row, followed by the data values for B1 bits b0-b7 stored in the memory cells 8-15 of the third row, and then static zero values stored in memory cells 16-23 in the second row; and so on.

Yet another embodiment of a memory architecture 21 that can feed a series of multi-bit data directly into a systolic array 23 includes the single memory array 1422 of FIG. 14. The memory array 1422 can include multi-port (MP) memory cells 30 (such as the 2P-SRAM cells 330 of FIG. 3) arranged in columns and rows. In this embodiment, the memory array 1422 can have the same number of rows, but more columns than the data input matrix 620. Specifically, the memory array 1422 can be configured in the same manner as the center portion 1301 of the memory array 1422 described above. That is, the memory array 1422 can have the same number m of rows as the data input matrix (e.g., 3 rows) and n times o columns (e.g., 24 columns). More specifically, in this embodiment, each row of memory cells of the memory array 1422 can include multiple sets of memory cells and each set can include memory cells that corresponds to the data input fields found at the same position in each layer of the data input matrix. That is, as mentioned above, the same positions (i.e., the same column and row addresses) in each layer of the data input matrix 620 correspond to a different bits (e.g., b0, b1, b2, b3, b4, b5, b6, b7) of a given multi-bit data input value (e.g., 8-bit data input value) for A1, B1, C1, A2, B2, C2, A3, B3, and C3. Thus, the memory array 1422 includes an m by n array of memory cell sets with each set having memory cells for storing all of the bits b0-b7 for a given multi-bit data value (e.g., for A1, B1, C1, etc.) and each row having n memory cell sets (with o memory cells each). Thus, the memory array 1422 has a total of ((m+n)−1) diagonals of memory cell sets (e.g., 5 diagonals of memory cell sets).

In this embodiment, the memory architecture 21 includes a second read wordline for each diagonal of memory cell sets. Thus, given the total of m rows, n×o columns, and ((m+n)−1) diagonals of memory cell sets in the memory array 1422, the memory architecture 21 includes m first wordlines (which are not shown in FIG. 14 in order to avoid clutter and allow the reader to focus on the salient aspects of the disclosed embodiment) with each of the m first wordlines being connected to all of the n×o memory cells in a corresponding one of the m rows to enable the first port write operations. This memory architecture embodiment also includes ((m+n)−1) second wordlines (e.g., 5 second wordlines, see RWL0-RWL4) with each of the ((m+n)−1) second wordlines being connected to all of the memory cells in all of the n memory cell sets in a corresponding one of the ((m+n)−1) diagonals of memory cell sets to enable the second port read operations. Thus, as illustrated, the second wordlines are stepped with portions oriented in both the Y direction (i.e., the same directions as the rows) along a given memory cell set and diagonally across to an adjacent row and another, lower, memory cell set.

In operation, the controller 26 can cause first port write operations to be performed using the first wordlines and, during the first port write operations, can cause the data input values from the data input matrix 620 to be written to corresponding memory cell addresses in the memory array 1422, as indicated. Following the first port write operations, the controller 26 can cause second port read operations to be performed in a predetermined sequence using the stepped second wordlines (e.g., RWL0 through RWL4 in sequence). However, since the memory array 1422 does not include the additional rows for storing the static zero values to match the static zero values in the data setup matrix 650, additional circuitry (including read data mask generators 14010-14012 and data output selectors 14020-14022) is included in the output blocks. The read data mask generators 14010-14012 and data output selectors 14020-14022 can be configured in a similar manner to the read data mask generators and data output selectors discussed above with regard to the memory array 822 in order to cause either a stored data value or a zero data value to be output depending upon which second wordline is currently active in order to ensure that the series of multi-bit data, which is read out by the memory architecture 21, is correct and in the proper order for being processed by the systolic array 23 (as specified by the data setup matrix 650 of FIG. 6).

That is, the second port read operations can begin by activating RWL0 (i.e., switching the voltage level of RWL0 to a logic "1") to read out, in sequence, the data value for the A1 bits b0-b7 stored in memory cells 0-7 of the third row, followed by static zero values stored in memory cells 8-15 in the second row, and then static zero values stored in memory cells 16-23 of the first row. Next, RWL1 can be activated (i.e., by switching the voltage level of RWL1 to a logic "1") to read out, in sequence, the data values for A2 bits b0-b7 stored in memory cells 0-7 in the fourth row, followed by the data values for B1 bits b0-b7 stored in the memory cells 8-15 of the third row, and then static zero values stored in memory cells 16-23 in the second row; and so on.

Additional embodiments of the memory architecture 21 can include various aspects of the different embodiments described above. For example, if a data input matrix indicates that the series of multi-bit data inputs to a systolic array 23 are are relatively long, then the memory architecture 21 can incorporate multiple memory arrays. Series of relatively small multi-bit outputs from the multiple memory arrays, respectively, can be combined such that the memory architecture 21 outputs a series of relatively large multi-bit outputs and such that the resulting series of multi-bit outputs is correct and in the proper order for processing by the systolic array 23 as specified by a data setup matrix 650. For example, one embodiment of the memory architecture 21 can include four multiple memory arrays 1522(1)-1522(4), as shown in FIG. 15, and each of the memory arrays 1522(1)-1522(4) can be configured in a similar manner as the memory array 1322 described above and illustrated in FIG. 13. Another embodiment of the memory architecture 21 can include four memory arrays 1622(1)-1622(4), as shown in FIG. 16, and each of the memory arrays 1622(1)-1622(4) can be configured in a similar manner as the memory array 1422 described above and illustrated in FIG. 14. In these embodiments, instead of the memory cell sets in each memory array including memory cells that correspond to all of the bits of a 32 bit data input value (as indicated by the data input matrix), the memory cell sets in each memory array can include a lesser number of memory cells, which correspond to only a portion (e.g., 1/4$^{th}$ of the 32 bits or 8-bits each). In these embodiments, the different memory cell sets in the first memory array 1522(1), 1622(1) can include memory cells that store bits b0-b7 of each multi-bit input value such that the first memory array outputs a series of 8-bit data The different memory cell sets in the second memory array 1522(2), 1622(2) can include memory cells that store bits b8-b15 of each multi-bit input value from the data input matrix 620 such that the second memory array outputs a different series of 8-bit data. The memory cell sets in the third memory array 1522(3), 1622(3) can include memory cells that store bits b16-b23 of each multi-bit input value such that the third memory array outputs another different series of 8-bit data. Finally, the different memory cell sets in the fourth memory array 1522(4), 1622(4) can include memory cells that store bits b24-b31 of each multi-bit input value such that the further memory array outputs another different series of 8-bit data. The series of 8-bit data from each of the memory arrays 1522(1)-1522(4), 1622(1)-1622(4) can be combined at the output of the memory architecture into a series of 32-bit data.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, fields, and/or components, but do not preclude the presence or addition of one or more other features, integers, steps, operations, fields, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one field physically contacts another field (without other fields separating the described fields). The term "laterally" is used herein to describe the relative locations of fields and, more particularly, to indicate that a field is positioned to the side of another field as opposed to above or below the other field, as those fields are oriented and illustrated in the drawings. For example, a field that is positioned laterally adjacent to another field will be beside the other field, a field that is positioned laterally immediately adjacent to another field will be directly beside the other field, and a field that laterally surrounds another field will be adjacent to and border the outer sidewalls of the other field. The corresponding structures, materials, acts, and equivalents of all means or step plus function fields in the claims below are intended to include any structure, material, or act for performing the function in combination with other claimed fields as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory architecture comprising:
    a memory array comprising multi-port memory cells arranged in rows and columns with a plurality of the memory cells being located along diagonals that linearly cross the rows and columns in a diagonal direction relative to the rows and columns, wherein the memory array is configured to output a series of data during read operations;
    first wordlines, wherein each first wordline is connected to all memory cells in a corresponding row of the memory cells in the memory array to enable first port write operations; and
    second wordlines, wherein each second wordline is connected to all memory cells in a corresponding one of the diagonals to enable second port read operations;
    wherein the memory array is configured according to a data setup matrix configured to specify an order in which the memory array outputs the series of data so that the data output by the memory array during the second port read operations is output directly to one of a plurality of processing elements of a systolic array in a proper order for processing by the processing elements of the systolic array.

2. The memory architecture of claim 1,
    wherein a data input matrix for the systolic array has m rows and n columns of data input fields, where m is a first number and n is a second number,
    wherein the data setup matrix is pre-generated based on the data input matrix and has ((m+n)−1) rows and n columns of data input fields, and
    wherein at least some of the data input fields at a beginning, at an end or at a beginning and end of each of the n columns comprise static zero value data input fields.

3. The memory architecture of claim 2, wherein the data setup matrix for the systolic array is pre-generated based on the data input matrix by:
    laterally inverting the data input matrix to generate a laterally inverted matrix;
    sliding individual columns within the laterally inverted matrix to generate a torqued matrix with opposing sides that are stepped; and
    adding the static zero value data input fields to fill in the stepped opposing sides and complete the data setup matrix.

4. The memory architecture of claim 3,
    wherein the memory array has a center area and side areas on opposing sides of the center area,
    wherein the center area corresponds to the data input matrix and each side area has (m−1) rows and n columns of the memory cells such that the memory array has a total of (2*(m−1)+m) rows, n columns and ((m+n)−1) full diagonals of the memory cells with each row and each full diagonal having a total of n memory cells,
    wherein the ((m+n)−1) full diagonals of the memory cells correspond to the ((m+n)−1) rows of fields in the data setup matrix, and
    wherein the memory architecture further comprises:
        2*(m−1)+m first wordlines with each of the 2*(m−1)+m) first wordlines being connected to all of the n memory cells in a corresponding one of the 2*(m−1)+m) rows to enable the first port write operations; and
        ((m+n)−1) second wordlines with each of ((m+n)−1) second wordlines being connected to all of the n memory cells in a corresponding one of the ((m+n)−1) full diagonals to enable the second port read operations.

5. The memory architecture of claim 4, further comprising a controller in communication with the memory array,
    wherein the controller causes the first port write operations to be performed using the first wordlines and, during the first port write operations, causes zero data values to be written to all memory cell addresses in the side areas and causes data input values from the data input matrix to be written to corresponding memory cell addresses in the center area, and
    wherein, following the first port write operations, the controller causes the second port read operations to be performed in a predetermined sequence using the second wordlines such that the series of data outputs from the memory architecture is in the proper order for being processed by the systolic array.

6. The memory architecture of claim 5,
    wherein the memory array corresponds to the data input matrix with ((m+n)−1) diagonals of the memory cells, and
    wherein the memory architecture further comprises:
        m first wordlines with each of the m first wordlines being connected to all of the n memory cells in a corresponding one of the m rows to enable the first port write operations; and ((m+n)−1) second wordlines with each of the ((m+n)−1) second wordlines being connected to all of the memory cells in a corresponding one of the ((m+n)−1) diagonals to enable the second port read operations.

7. The memory architecture of claim 6, further comprising read data mask generators, the controller being in communication with the read data mask generators and the memory array, wherein the controller causes the first port write operations to be performed using the first wordlines and, during the first port write operations, causes the data input values from the data input matrix to be written to corresponding memory cell addresses in the memory array, and wherein, following the first port write operations, the controller causes the second port read operations to be performed in a predetermined sequence using the second wordlines and further employs the read data mask generators to ensure that the series of data outputs is in the proper order for being processed by the systolic array.

8. The memory architecture of claim 6, wherein each read data mask generator is associated with a given column of the memory cells in the memory array, wherein, for any second port read operations associated with memory cells in a non-full diagonal having less than a total of n memory cells, the read data mask generators causes one or more additional data values of zero to be output to achieve a total of n data outputs, wherein each read data mask generator comprises a logic circuit configured to receive a bit word that identifies an active second wordline and to output a read data mask of 0 or a read data mask of 1 based on the bit word, and wherein the read data mask of 0 forces an actual stored data value to be output and the read data mask of 1 forces a 0 data value to be output.

9. A memory architecture comprising:

multiple memory arrays, wherein each memory array comprises multi-port memory cells arranged in rows and columns with a plurality of the memory cells being located along diagonals that linearly cross the rows and columns in a diagonal direction relative to the rows and columns; first wordlines; and second wordlines, wherein each first wordline of each memory array is connected to all memory cells in a corresponding row of the memory cells to enable first port write operations, wherein each second wordline of each memory array is connected to all memory cells in a corresponding one of the diagonals to enable second port read operations, wherein the multiple memory arrays are further configured so that, when the second port read operations are performed in parallel in the multiple memory arrays, series of single-bit outputs from the memory arrays, respectively, combine to form a series of multi-bit outputs that are output directly to one of a plurality of processing elements of a systolic array in a proper order for processing by the processing elements of the systolic array, and wherein each of the multiple memory arrays is configured according to a data setup matrix that specifies the proper order.

10. A memory architecture comprising:

a memory array comprising multi-port memory cells arranged in columns and rows, wherein each row comprises multiple memory cell sets such that the memory array further includes memory cell sets located along diagonals that linearly cross the columns and rows in a diagonal direction relative to the columns and rows;

first wordlines, wherein each first wordline is connected to all of the memory cells of all of the memory cell sets in a corresponding row of the memory cells to enable first port write operations; and second wordlines, wherein each second wordline is connected to all of the memory cells in all of the memory cell sets in a corresponding one of the diagonals to enable second port read operations, wherein the memory array is further configured such that a series of multi-bit outputs from the memory architecture during the second port read operations is output directly to one of a plurality of processing elements of a systolic array in a proper order for processing by the processing elements of the systolic array, and wherein the memory array is configured according to a data setup matrix that specifies the proper order.

11. The memory architecture of claim 10, wherein a data input matrix for the systolic array has m rows, n columns and o layers of data input fields, where m is a first number, n is a second number and o is a third number, wherein the data setup matrix is pre-generated based on the data input matrix and has ((m+n)−1) rows, n columns and o layers of the data input fields, wherein groupings of data input fields that include all data input fields at a same row and column position in each layer correspond to multi-bit inputs, respectively, for the systolic array, and wherein at least some of the data input fields at a beginning, at an end or at a beginning and end of each of the n columns in each of the o layers of the data setup matrix comprise static zero value data input fields.

12. The memory architecture of claim 11, wherein the data setup matrix for the systolic array is pre-generated based on the data input matrix by:

laterally inverting each layer of the data input matrix to generate a laterally inverted matrix;

sliding individual columns within layers of the laterally inverted matrix to generate a torqued matrix with opposing sides that are stepped; and adding the static zero value input fields to fill in the stepped opposing sides and complete the data setup matrix.

13. The memory architecture of claim 12, wherein the memory array has a center area and side areas on opposing sides of the center area, wherein the center area has m rows of the memory cells, each side area has (m−1) rows of the memory cells, and each of the rows has n memory cell sets each having o memory cells such that the memory array has a total of (2*(m−1)+m) rows of the memory cells and n times o columns of the memory cells, wherein each memory cell set in a given row corresponds to a set of data input fields that includes all data input fields at a same row and column position in each layer of the data input matrix, and wherein the memory architecture further comprises:
2*(m−1)+m) first wordlines; and
((m+n)−1) second wordlines.

14. The memory architecture of claim 13, further comprising a controller in communication with the memory array,
wherein the controller causes the first port write operations to be performed using the first wordlines and, during the first port write operations, causes zero data values to be written to all memory cell addresses in the side areas and causes data input values from the data input matrix to be written to corresponding memory cell addresses in the center area, and
wherein, following the first port write operations, the controller causes the second port read operations to be performed in a predetermined sequence using the second wordlines such that the series of multi-bit outputs is in the proper order.

15. The memory architecture of claim 14,
wherein the memory array has m rows of the memory cells with each of the rows having n sets of o memory cells such that the memory array has n times o columns of the memory cells, and
wherein the memory architecture further comprises:
m first wordlines; and
((m+n)−1) second wordlines.

16. The memory architecture of claim 15, further comprising read data mask generators, the controller being in communication with the read data mask generators,
wherein the controller causes the first port write operations to be performed using the first wordlines and, during the first port write operations, causes the data input values from the data input matrix to be written to associated memory cell addresses within the memory array, and
wherein, following the first port write operations, the controller causes the second port read operations to be performed in a predetermined sequence using the second wordlines and further employs the read data mask generators to ensure that the series of multi-bit outputs is in the proper order for being processed by the systolic array.

17. The memory architecture of claim 16,
wherein each read data mask generator is associated with a given column of the memory array,
wherein each read data mask generator comprises a logic circuit configured to receive a bit word that identifies an active second wordline and to output a read data mask of 0 or a read data mask of 1 based on the bit word, and
wherein the read data mask of 0 forces an actual stored data value to be output and the read data mask of 1 forces a 0 data value to be output.

18. The memory architecture of claim 10, further comprising multiple memory arrays, wherein series of relatively short multi-bit outputs from the memory arrays, respectively, are combined to generate a series of relatively long multi-bit inputs for the systolic array.

19. The memory architecture of claim 10, further comprising four memory arrays, wherein series of eight-bit outputs from the four memory arrays, respectively, are combined to generate a series of 32-bit inputs for the systolic array.

* * * * *